US010598393B2

(12) United States Patent
Oya et al.

(10) Patent No.: US 10,598,393 B2
(45) Date of Patent: Mar. 24, 2020

(54) ELECTRIC-POWER CONTROL DEVICE, ELECTRIC MOTOR, AIR-CONDITIONING APPARATUS, AND METHOD FOR MANUFACTURING ELECTRIC MOTOR

(71) Applicant: Mitsubishi Electric Corporation, Tokyo (JP)

(72) Inventors: Junichiro Oya, Tokyo (JP); Mineo Yamamoto, Tokyo (JP); Hiroyuki Ishii, Tokyo (JP); Yuto Urabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/321,875

(22) PCT Filed: Oct. 25, 2016

(86) PCT No.: PCT/JP2016/081575
§ 371 (c)(1),
(2) Date: Jan. 30, 2019

(87) PCT Pub. No.: WO2018/078719
PCT Pub. Date: May 3, 2018

(65) Prior Publication Data
US 2019/0242594 A1     Aug. 8, 2019

(51) Int. Cl.
*H02P 5/00*     (2016.01)
*H02P 5/46*     (2006.01)
(Continued)

(52) U.S. Cl.
CPC ............... *F24F 1/38* (2013.01); *H02K 5/225* (2013.01); *H02K 11/33* (2016.01); *H02K 11/35* (2016.01);
(Continued)

(58) Field of Classification Search
CPC ........................................................ F24F 1/38
(Continued)

(56) References Cited

U.S. PATENT DOCUMENTS

2009/0246047 A1*  10/2009  Hattori ................... H02K 11/01
                                                                              417/410.1
2010/0327678 A1*  12/2010  Yamasaki .............. H02K 3/522
                                                                              310/64

(Continued)

FOREIGN PATENT DOCUMENTS

EP     2616644 B1    6/2016
GB     2517326 A     2/2015
(Continued)

OTHER PUBLICATIONS

International Search Report of the International Searching Authority dated Jan. 24, 2017 for the corresponding international application No. PCT/JP2016/081575 (and English translation).
(Continued)

*Primary Examiner* — Erick D Glass
(74) *Attorney, Agent, or Firm* — Posz Law Group, PLC

(57) ABSTRACT

An electric-power control device including a substrate of an annular shape in which a through hole is formed and a connector is arranged in a peripheral part, the electric-power control device driving an electric motor. On the substrate, a power semiconductor module is mounted on a first region on one side relative to a straight line connecting the center of the through hole to the center of the connector, and a microcomputer is mounted on a second region on the other side. Furthermore, a first ground pattern part that is formed extending from the power semiconductor module toward the connector in the first region and a second ground pattern part that is formed extending from the microcomputer toward the connector in the second region are provided on the substrate.

15 Claims, 13 Drawing Sheets

(51) Int. Cl.
*H02P 7/06* (2006.01)
*F24F 1/38* (2011.01)
*H05K 1/18* (2006.01)
*H02K 5/22* (2006.01)
*H02K 15/00* (2006.01)
*H02K 11/33* (2016.01)
*H02K 11/40* (2016.01)
*H02K 11/35* (2016.01)
*H02P 27/06* (2006.01)
*H05K 1/02* (2006.01)
*H05K 5/06* (2006.01)

(52) U.S. Cl.
CPC ......... *H02K 11/40* (2016.01); *H02K 15/0062* (2013.01); *H02P 27/06* (2013.01); *H05K 1/0216* (2013.01); *H05K 1/181* (2013.01); *F25B 2339/04* (2013.01); *H05K 5/065* (2013.01); *H05K 2201/09027* (2013.01); *H05K 2201/10545* (2013.01)

(58) Field of Classification Search
USPC .......................................................... 318/82
See application file for complete search history.

(56) References Cited

U.S. PATENT DOCUMENTS

| | | | | |
|---|---|---|---|---|
| 2014/0125164 | A1* | 5/2014 | Mukunoki | H05K 7/20927 310/54 |
| 2017/0072773 | A1 | 3/2017 | Hattori | |
| 2019/0190354 | A1* | 6/2019 | Leman | H05K 3/28 |

FOREIGN PATENT DOCUMENTS

| | | |
|---|---|---|
| JP | H08-289595 A | 11/1996 |
| JP | 2008-130584 A | 6/2008 |
| JP | 2009-247066 A | 10/2009 |
| JP | 2016-077092 A | 5/2016 |
| WO | 2012/034791 A1 | 3/2012 |
| WO | 2015/156063 A1 | 10/2015 |

OTHER PUBLICATIONS

Office Action dated Dec. 12, 2019 issued in corresponding AU patent application No. 2016427571.
Extended European Search Report dated Oct. 1, 2019 issued in corresponding EP patent application No. 16920338.7.

* cited by examiner (COUNTER-STATOR SURFACE)

(STATOR SURFACE)

(COUNTER-STATOR SURFACE)

(STATOR SURFACE)

ELECTRIC-POWER CONTROL DEVICE, ELECTRIC MOTOR, AIR-CONDITIONING APPARATUS, AND METHOD FOR MANUFACTURING ELECTRIC MOTOR

CROSS REFERENCE TO RELATED APPLICATION

This application is a U.S. national stage application of PCT/JP2016/081575 filed on Oct. 25, 2016, the contents of which are incorporated herein by reference.

TECHNICAL FIELD

The present invention relates to an electric-power control device which controls electric power to be supplied, an electric motor, an air-conditioning apparatus, and a method for manufacturing the electric motor.

BACKGROUND ART

Conventional electric motors are each provided with an electric-power control device which controls driving of a motor main body including a rotor, a stator, etc. The electric-power control device includes a substrate on which a power IC, a microcomputer, etc., are mounted. As the substrate, for example, an annular substrate having a through hole is adopted, the through hole being formed to allow, for example, a rotation shaft of the rotor, to pass through the through hole (see, for example, Patent Literature 1).

CITATION LIST

Patent Literature

Patent Literature 1: Japanese Unexamined Patent Application Publication No. 2016-77092

SUMMARY OF INVENTION

Technical Problem

In an electric-power control device disclosed in Patent Literature 1, a ground terminal of a power IC and a ground terminal of a microcomputer are connected to a ground electrode of a substrate that is formed in a single pattern. Therefore, heat generated at the power IC is directly transmitted to the microcomputer via the ground electrode. Inevitably, the temperature of the microcomputer rises.

The present invention has been made in view of the above problem, and an object of the present invention is to provide an electric-power control device which reduces raising of the temperature of a microcomputer, an electric motor, an air-conditioning apparatus, and a method for manufacturing the electric motor.

Solution to Problem

An electric-power control device according to an embodiment of the present invention drives an electric motor including a rotor into which a rotation shaft is inserted and a stator provided on an outer peripheral side of the rotor. The electric-power control device includes: an annular substrate including a through hole through which the rotation shaft passes, the substrate being provided to face the rotor and the stator; a connector which is provided at a peripheral portion of the substrate, and to which a lead wire is connected; a power semiconductor module mounted on a first region which is one of sides of the substrate which are divided with respect to a straight line connecting a center of the through hole to a center of the connector, the power semiconductor module including a ground terminal and a driving circuit; and a microcomputer mounted on a second region which is an other of the sides of the substrate, the microcomputer including a ground terminal and being configured to control electric power to be supplied to the electric motor. On the substrate, a first ground pattern portion, a second ground pattern portion and a connection portion is provided. The first ground pattern portion is provided as a ground electrode which is connected to the ground terminal of the power semiconductor module, and formed to extend from the power semiconductor module toward the connector in the first region. The second ground pattern portion is provided as a ground electrode which is separated from the first ground pattern portion, connected to the ground terminal of the microcomputer, and formed to extend from the microcomputer toward the connector in the second region. The connection portion connects part of the first ground pattern portion that is close to the connector and part of the second ground pattern portion that is close to the connector.

An electric motor according to another embodiment of the present invention includes: a rotor into which a rotation shaft is inserted; a stator which is provided on an outer peripheral side of the rotor; and the above electric-power control device. The stator and the electric-power control device are integrally molded out of a mold resin.

In an air-conditioning apparatus according to a further embodiment of the present invention, a compressor, a condenser, an expansion valve and an evaporator are connected by pipes to circulate refrigerant. The air-conditioning apparatus includes a fan which sends air to at least one of the condenser and the evaporator. The air-conditioning apparatus includes the above electric motor as a power source for the fan.

A method for manufacturing an electric motor, according to another embodiment of the present invention, the electric motor including a rotor into which a rotation shaft is inserted and a stator which is provided on an outer peripheral side of the rotor, includes: a ground pattern forming step of forming, on an annular substrate including a through hole through which the rotation shaft passes, a first ground pattern portion which is connected to a ground terminal of a power semiconductor module and a second ground portion which is connected to a ground terminal of a microcomputer; and a component mounting step of mounting the power semiconductor module on a first region which is one of sides of the substrate which are divided with respect to a straight line connecting a center of the through hole to a center of a connector provided at a peripheral portion of the substrate, and also mounting the microcomputer on a second region which is an other of the substrate. In the ground pattern forming step, the first ground pattern portion is formed to extend from the power semiconductor module toward the connector in the first region, and the second ground pattern portion is formed to extend from the microcomputer toward the connector in the second region and separately from the first ground pattern portion.

Advantageous Effects of Invention

According to an embodiment of the present invention, a first ground pattern portion and a second ground pattern portion are provided in different regions on a substrate. Thus, heat generated at a power semiconductor module is

DESCRIPTION OF EMBODIMENTS

Embodiment 1

Figure 1:
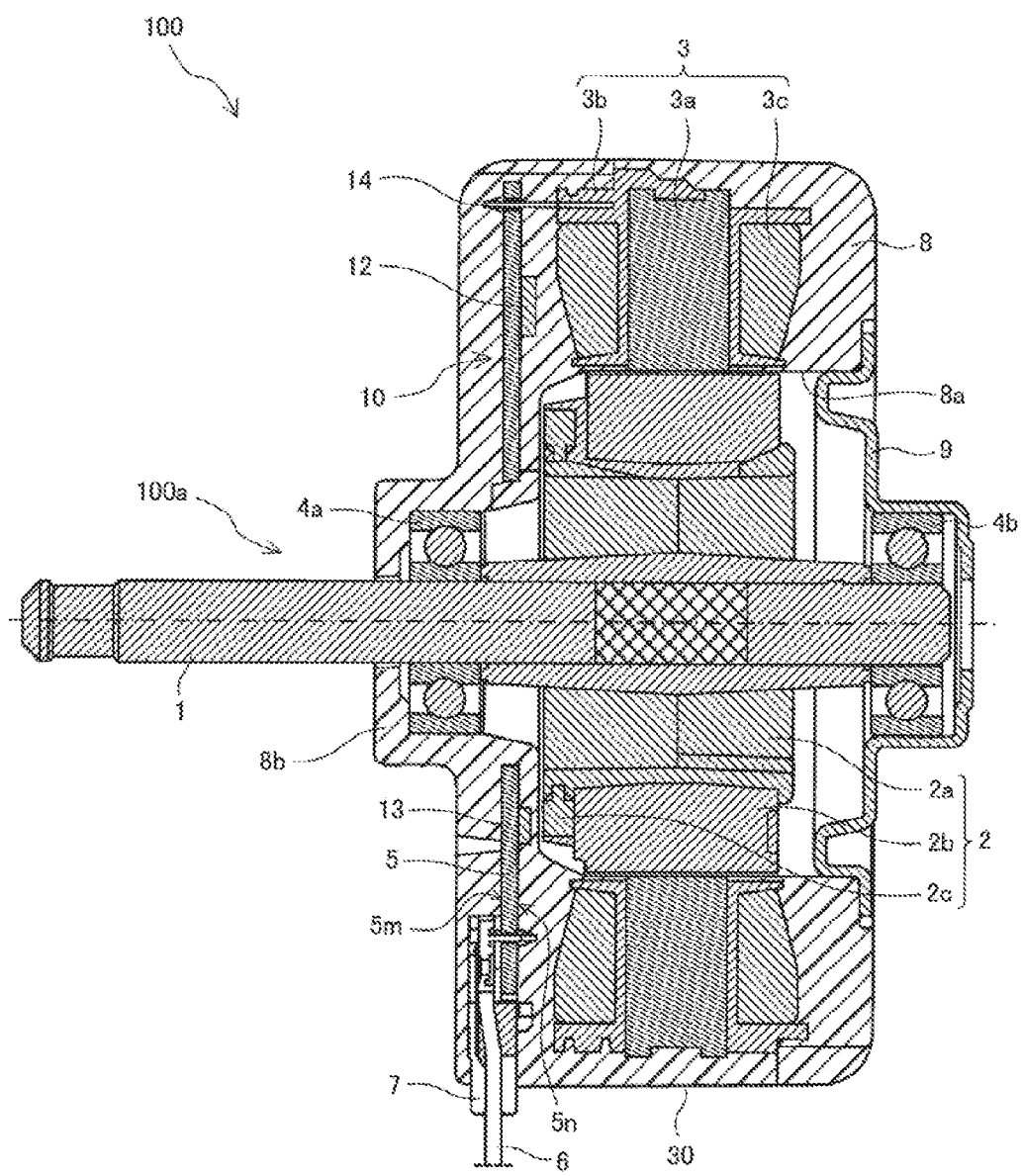
FIG. 1 is a schematic cross-sectional view illustrating a configuration of an electric motor according to embodiment 1 of the present invention.
Figure 2:
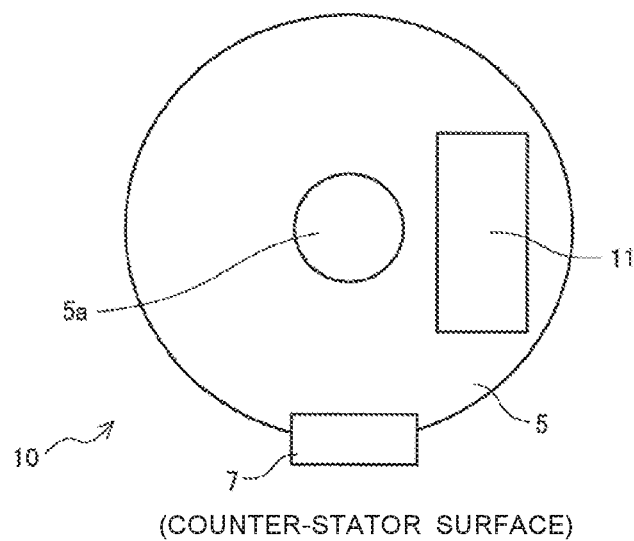
FIG. 2 is a schematic view illustrating a configuration of an electric-power control device provided in the electric motor as illustrated in FIG. 1 as the electric-power control device is viewed from a counter-stator side.
Figure 3:
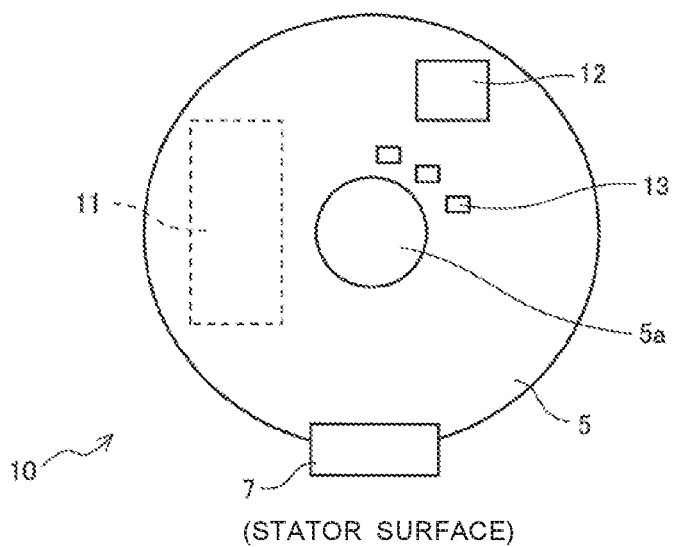
FIG. 3 is a schematic view illustrating a configuration of the electric-power control device provided in the electric motor as Illustrated in FIG. 1 as the electric-power control device is viewed from a stator side.
Figure 4:
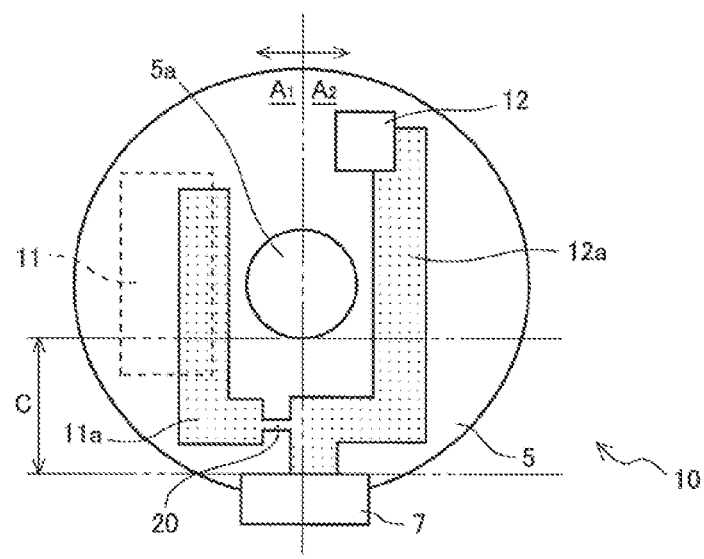
FIG. 4 is a schematic view illustrating an example of the electric-power control device as illustrated in FIG. 3 including GND patterns provided at a substrate.
Figure 5:
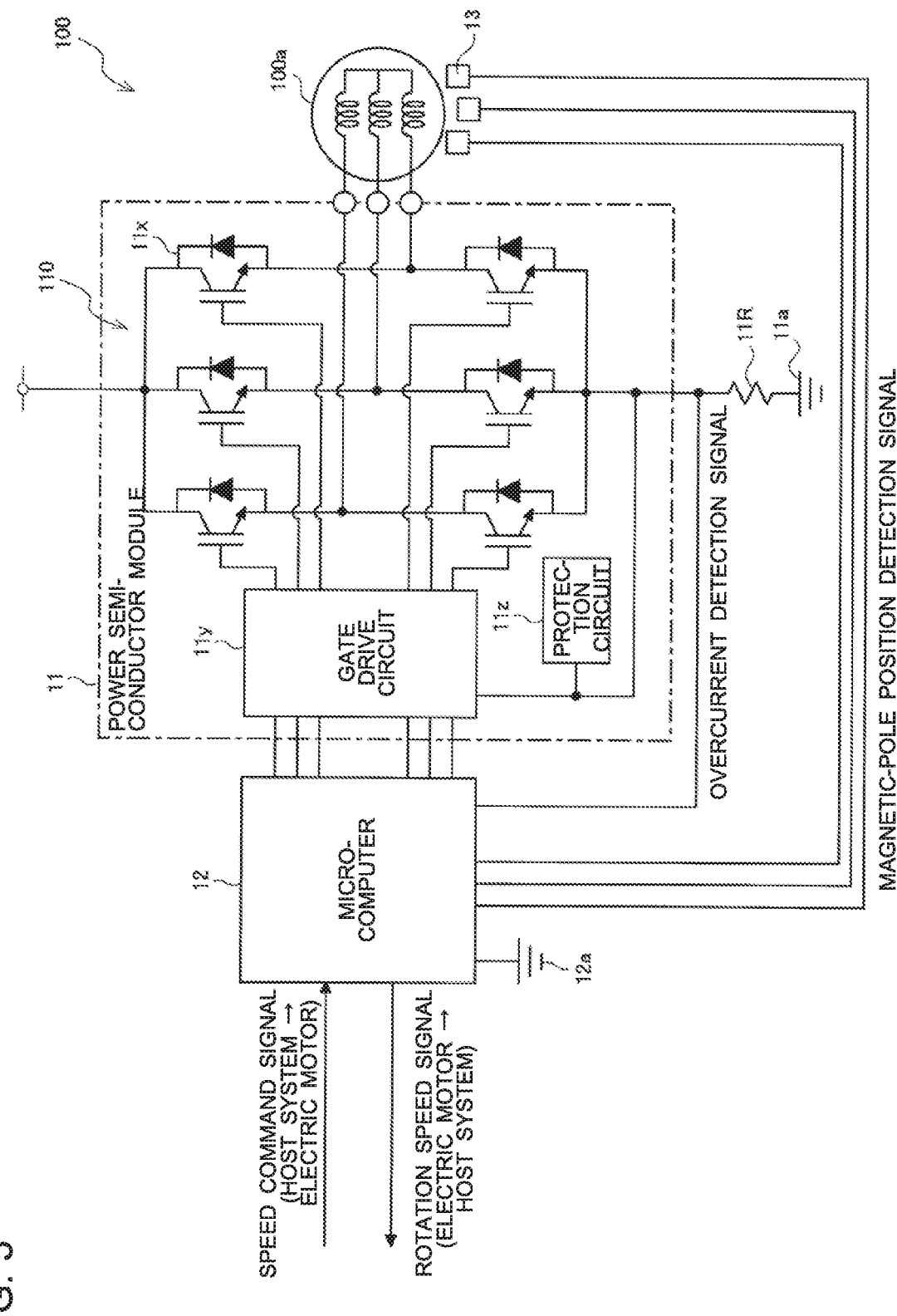
FIG. 5 is a circuit diagram illustrating an example of a circuit configuration of the electric-power control device provided in the electric motor illustrated in FIG. 1.

FIG. 1 is a schematic cross-sectional view illustrating a configuration of an electric motor according to embodiment 1 of the present invention. FIG. 2 is a schematic view which illustrates a configuration of an electric-power control device provided in the electric motor as illustrated in FIG. 1, as the electric-power control device is seen from a counter-stator side. FIG. 3 is a schematic view which illustrates a configuration of the electric-power control device provided in the electric motor as illustrated in FIG. 1, as the electric-power control device is seen from a stator side. FIG. 4 is a schematic view which illustrates an example of the electric-power control device as illustrated in FIG. 3, along with GND patterns provided at a substrate. FIG. 5 is a circuit view illustrating an example of a circuit configuration of the electric-power control device provided in the electric motor as illustrated in FIG. 1. A configuration of an electric motor 100 in embodiment 1 will be explained with reference to FIGS. 1 to 5.

The electric motor 100 is, for example, a brushless DC motor to be driven by an inverter, and outputs power to a load connected to a rotation shaft 1, which will be described later. As illustrated in FIG. 1, the electric motor 100 includes a motor main body 100a and an electric-power control device 10 which generates electric power for driving the motor main body 100a, in response to a speed command signal from a host system for the electric motor 100. The host system for the electric motor 100 is a control substrate of an apparatus incorporating the electric motor 100. For example, in the case where the electric motor 100 is incorporated into in an air-conditioner, a control substrate on a unit side of the air-conditioner corresponds to a host system for the electric motor 100.

The motor main body 100a includes the rotation shaft 1, a rotor 2 into which the rotation shaft 1 is inserted, a stator 3 provided in an annular shape on an outer peripheral side of the rotor 2, and an output-side bearing 4a and a counter-output-side bearing 4b that support the rotation shaft 1 in such way as to allow the rotation shaft 1 to be rotated. The output-side bearing 4a supports the rotation shaft 1 at one of ends of the rotation shaft 1 in such a way as to allow the rotation shaft 1 to be rotated. The counter-output-side bearing 4b supports the rotation shaft 1 at the other end of the rotation shaft 1 in such a way as to allow the rotation shaft 1 to be rotated.

The stator 3 includes a stator core 3a, an insulator 3b and a winding 3c. The stator core 3a is formed of a plurality of electromagnetic steel sheets stacked together. The insulator 3b is provided to insulate the stator core 3a and the winding 3c from each other, and is molded integrally with the stator core 3a. The winding 3c is wound around each of slots of the stator core 3a which is molded integrally with the insulator 3b.

The electric-power control device 10 is provided to drive the electric motor 100, and includes a substrate 5 provided on an output side of the stator 3. Between the stator 3 and the output-side bearing 4a, the substrate 5 is located to extend in a direction perpendicular to an axial direction of the rotation shaft 1, and is fixed at the insulator 3b. In the substrate 5, a through hole 5a is formed to allow the rotation shaft 1 and the output-side bearing 4a to pass through the through hole 5a. That is, the substrate 5 is formed in a ring shape and located to face the rotor 2 and the stator 3. The substrate 5 as illustrated in FIGS. 2 to 4 is formed annularly, and the through hole 5a, which is circular, is provided in the substrate 5.

At a peripheral portion of the substrate 5, a connector 7 to which a lead wire 6 is connected is provided. The lead wire 6 is connected to the host system for the electric motor 100, and supplies a control signal and electric power to each of components mounted on the substrate 5. The connector 7 is, for example, a connector, and is connected to the host system for the electric motor 100 by the lead wire 6.

As illustrated in FIG. 2, a power semiconductor module 11, for example, a power IC (integrated circuit), is mounted on a counter-stator surface 5m, i.e., a surface of the substrate 5 which is located opposite to a surface thereof which is closer to the stator 3. The power semiconductor module 11 is mounted on a first region $A_1$, which is one of sides of the substrate 5 which are divided with respect to a straight line connecting the center of the through hole 5a to the center of the connector 7, as illustrated in FIG. 4, and includes a ground terminal.

As illustrated in FIG. 3, a microcomputer 12 for electric-power control and a magnetic-pole position detection sensor 13 which detects the position of the rotor 2 are mounted on a stator surface 5n which is the above surface closer to the stator 3. The microcomputer 12 controls electric power to be supplied to the electric motor 100. As illustrated in FIG. 4, the microcomputer 12 is mounted on a second region $A_2$, which is a side of the substrate 5 which is other than the above one of the sides of the substrate 5 which are divided with respect to the straight line connecting the center of the through hole 5a to the center of the connector 7. The microcomputer 12 includes a ground terminal. In the example of FIGS. 3 and 4, the distance between the microcomputer 12 and the connector 7 is longer than that between the through hole 5a and the connector 7. The magnetic-pole position detection sensor 13 is, for example, a magnetic sensor such as a hall IC.

Furthermore, passive components (not illustrated) such as a resistor and a capacitor are arranged on the stator surface 5n of the substrate 5. That is, the substrate 5 is provided with an electric-power control circuit including the power semiconductor module 11, the microcomputer 12 and the magnetic-pole position detection sensor 13.

In embodiment 1, the power semiconductor module 11 is of a lead type, and only the power semiconductor module 11 is provided on the counter-stator surface 5m of the substrate 5. The power semiconductor module 11 may be mounted by a single-surface flow. The power semiconductor module 11 and the winding 3c are connected by a winding terminal 14 as illustrated in FIG. 1.

As the microcomputer 12, a device incorporating a flash memory, which is a nonvolatile memory, can be adopted. In the case where the electric-power control device 10 includes the microcomputer 12 incorporating a flash memory, it can store operation information such as cumulative data on operation time and data on the frequency of ON/OFF. Therefore, if the electric motor 100 is returned because of, for example, occurrence of a failure in the electric motor 100, operation information stored in the flash memory can be used to determine why the failure occurs. That is, it is possible to accurately determine why the failure occurs by examining operation information on the electric motor 100.

Furthermore, the motor main body 100a includes: a housing 8 which is formed of mold resin, and molds the stator 3, the substrate 5 and the connector 7 integrally with each other; and a bracket 9 which surrounds an outer ring of the counter-output-side bearing 4b, and which is fitted in an inner-diameter portion 8a formed at the housing 8.

The housing 8 forms an outer frame of the electric motor 100, and also includes a bearing supporting portion 8b which surrounds an outer ring of the output-side bearing 4a. The stator 3 and the electric-power control device 10 are integrally molded out of a mold resin forming the housing 8. In the electric motor 100, the stator 3 including the winding 3c and the substrate 5 are integrally molded out of the mold resin forming the housing 8, and a mold stator 30 having an outer frame formed out of a mold resin can be formed. The inside of the mold stator 30 is formed to include a recessed portion which can accommodate the rotor 2. The bracket 9 is electrically conductive. The bracket 9 is fitted in an inner peripheral portion of the mold stator 30 in such a way as to close an opening portion of the recessed part of the mold stator 30, and the outer ring of the counter-output-side bearing 4b is fitted to an inner portion of the bracket 9.

The rotor 2 includes: a rotor main body 2a which is made of, for example, resin, and provided on an outer peripheral side of the rotation shaft 1; a rotor magnet 2b which is provided on the outer peripheral side of the rotation shaft 1 and rotor main body 2a and located to face the stator core 3a; and a sensor magnet 2c which is provided on an end portion of the rotor magnet 2b that is closer to the substrate 5, and located to face the magnetic-pole position detection sensor 13. The rotor main body 2a insulates the rotation shaft 1 and the rotor magnet 2b from each other, and insulates the rotation shaft 1 and the stator core 3a from each other. The rotor magnet 2b includes a permanent magnet such as a ferrite magnet or a rare-earth magnet. The sensor magnet 2c is provided at a predetermined position in the rotor 2, which can be rotated along with the rotation shaft 1, such that the sensor magnet 2c is located close to the magnetic-pole position detection sensor 13 of the substrate 5.

As illustrated in FIG. 4, a first ground patter portion 11a, which is a GND patter connected to a ground terminal (GND terminal) of the power semiconductor module 11, and a second ground patter portion 12a, which is a GND pattern connected to a ground terminal of the microcomputer 12, are separately provided at the substrate 5. That is, the first ground pattern portion 11a and the second ground pattern portion 12a are separated from each other on the substrate 5.

The first ground pattern portion 11a is a ground electrode, and is formed to extend from the power semiconductor module 11 toward the connector 7 in the first region $A_1$. The first ground pattern portion 11a is provided opposite to the second ground pattern portion 12a with respect to the through hole 5a. That is, the first ground patter portion 11a is formed in a region which is located opposite to the microcomputer 12 with respect to the through hole 5a, and in such a way as to extend from the power semiconductor module 11 toward the connector 7.

The second ground patter portion 12a is a ground electrode, and is formed to extend from the microcomputer 12 toward the connector 7 in the second region $A_2$. The second ground pattern portion 12a is provided opposite to the first ground patter portion 11a with respect to the through hole 5a. That is, the second ground patter portion 12a is formed in a region which is located opposite to the power semiconductor module 11 with respect to the through hole 5*a*, and in such a way as to extend from the microcomputer 12 toward the connector 7.

Furthermore, a connection portion 20 is formed on the substrate 5, and is a ground electrode for connecting part of the first ground pattern portion 11*a* which is close to the connector 7 to part of the second ground pattern portion 12*a* which is close to the connector 75. The connection portion 20 is provided in a connection region C located between the through hole 5*a* and the connector 7. That is, the first ground pattern portion 11*a* and the second ground pattern portion 12*a* are connected to each other only by the connection portion 20 in the connection region C. In the example of FIG. 4, the distance between the connection portion 20 and the connector 7 is shorter than that between the through hole 5*a* and the connector 7. The ground terminal of the microcomputer 12 is connected to the first ground pattern portion 11*a*, which is connected to the ground terminal of the power semiconductor module 11, by the second ground pattern portion 12*a* and the connection portion 20.

As described above, in the electric-power control device 10, the length of the GND pattern from the power semiconductor module 11 to the microcomputer 12 is longer than the distance from the power semiconductor module 11 to the microcomputer 12 in the case where the power semiconductor module 11 and the microcomputer 12 are connected to each other along the shortest path. Therefore, the amount of heat transmitted from the power semiconductor module 11 to the microcomputer 12 through the GND pattern can be reduced.

Furthermore, the connection portion 20 is a GND pattern which is formed narrower than the first ground pattern portion 11*a* and the second ground pattern portion 12*a*. Therefore, in the electric-power control device 10, the connection portion 20 can hinder transmission of heat from the first ground pattern portion 11*a* to the second ground pattern portion 12*a*, as a result of which transmission of heat generated at the power semiconductor module 11 to the microcomputer 12 can be further reduced.

In the example of FIG. 4, the second ground pattern portion 12*a* is provided in a region which is located opposite to the power semiconductor module 11 with respect to the through hole 5*a*, and is connected to the first ground pattern portion 11*a* by the connection portion 20 at a position located opposite to the microcomputer 12 with respect to the through hole 5*a*.

The substrate 5 may be formed by integral molding using resin. In the case where the substrate 5 is integrally molded out of resin, heat generated at the power semiconductor module 11 is transferred via the resin from a long GND pattern including the first ground pattern portion 11*a*, the second ground pattern portion 12*a* and the connection portion 20. Therefore, the amount of heat transmitted to the microcomputer 12 can be further reduced.

As illustrated in FIG. 5, the power semiconductor module 11 includes a driving circuit 110 which includes six power transistors 11*x* including switching elements such as insulated gate bipolar transistors (IGBTs). The driving circuit 110 is an inverter circuit which converts an externally input voltage into a three-phase AC voltage by operation of each of the power transistors 11*x*, and applies the three-phase AC voltage to the motor main body 100*a*. Furthermore, the power semiconductor module 11 includes low-voltage circuits such as a gate drive circuit 11*y* and a protection circuit 11*z*.

The electric motor 100 including a brushless DC motor obtains rotation motion by switching the six power transistors 11*ix* provided in the power semiconductor module 11 at appropriate timing in accordance with a magnetic-pole position of the rotor magnet 2*b*. A switching signal for ON/OFF operation of the six power transistors 11*x* is produced and output from the microcomputer 12.

Operation principles of the electric motor 100 will be described below.

(1) The magnetic-pole position detection sensor 13 outputs a magnetic-pole position detection signal indicating the magnetic-pole position of the rotor magnet 2*b* to the microcomputer 12. That is, the magnetic-pole position detection signal is input to the microcomputer 12.

(2) The microcomputer 12 determines by estimation the magnetic-pole position of the rotor 2 based on the magnetic-pole position detection signal input from the magnetic-pole position detection sensor 13.

(3) Then, the microcomputer 12 produces a switching signal based on the determined magnetic-pole position of the rotor 2 and a speed command signal output from a host system, and outputs the switching signal to the power semiconductor module 11.

The microcomputer 12 monitors the voltage across an overcurrent detection resistor 11R. When the voltage across the overcurrent detection resistor 11R reaches a set voltage or higher, the microcomputer 12 forcibly turns off the power transistors 11*x* to achieve overcurrent protection. Furthermore, the microcomputer 12 forcibly turns off the power transistors 11*x* upon reception of an overcurrent detection signal from a thermosensitive element (not illustrated) to achieve overheat protection.

As described above, for electric power control, the electric-power control device 10 uses the microcomputer 12, not a dedicated IC. It is therefore possible to control the motor with a high precision by adjusting fine control parameters and using complicated control algorithms. Thus, in the electric motor 100, a high efficiency and low noise can be achieved, and the maximum output can be increased. Furthermore, by setting specifications of the winding 3*c*, specifications of the rotor magnet 2*b* of the rotor 2 and a control parameter according with a target to which a rotation load is to be applied, the motor control can be performed with a higher precision. Therefore, far higher efficiency and lower noise can be achieved, and the maximum output can be further increased.

In the case where the electric-power control device 10 includes the microcomputer 12 incorporating a flash memory, and has a flash rewrite function for rewriting data stored in the flash memory after the electric motor 100 is manufactured, the amounts of various discrepancies can be corrected after the electric motor 100 is manufactured. In this case, a dedicated lead wire for use in transmission of a signal for rewriting the data in the flash memory is provided in the microcomputer 12. The data in the flash memory is rewritten via the dedicated lead wire by, for example, I2C communication.

As the amounts of discrepancies which can be corrected after the electric motor 100 is manufactured, a phase shift between a magnetic-pole position and a magnetic-pole position detection signal, the amounts of discrepancies between actual values and design values, such as an overcurrent limit value, are present. That is, the electric-power control device 10 having the flash rewrite function can perform motor control, after measuring the amounts of the above various discrepancies, etc. and writing parameters for correcting the amounts of the discrepancies, etc., to the flash memory. Therefore, in the electric-power control device 10, it is possible to reduce the phase shift between a magnetic-pole position and a magnetic-pole position detection signal, and variations between overcurrent limit values, etc.

Figure 6:
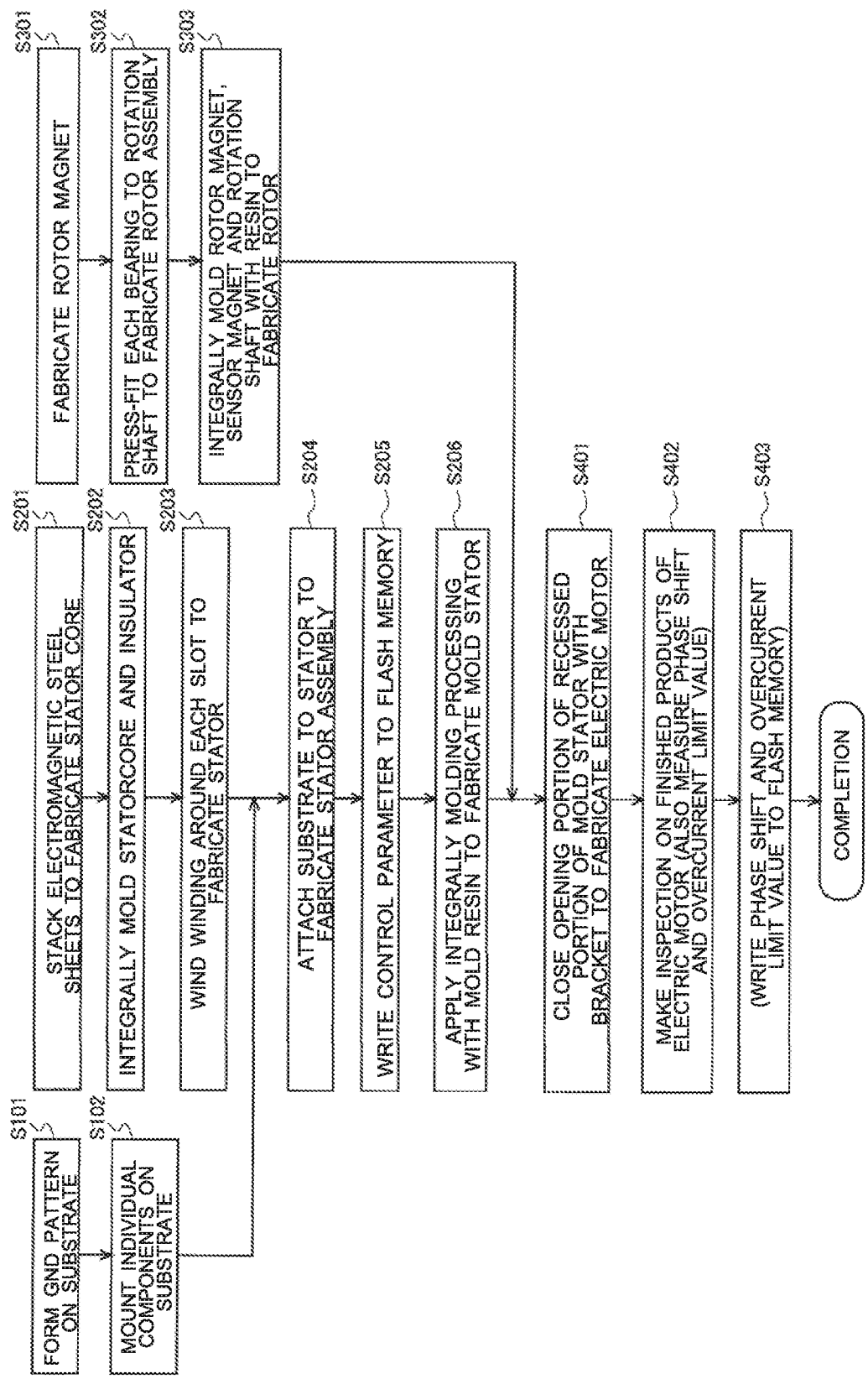
FIG. 6 is a flowchart illustrating an example of a process for manufacturing the electric motor illustrated in FIG. 1.

FIG. 6 is a flowchart illustrating an example of processes for manufacturing the electric motor 100 as illustrated in FIG. 1. A method for manufacturing the electric motor 100 will be explained with reference to FIG. 6.

[Process for Mounting Elements on Substrate 5]

The GND pattern including the first ground pattern portion 11a, the second ground pattern portion 12a and the connection portion 20 is formed on the substrate 5 by a solid pattern made of copper. To be more specific, in the first region $A_1$, the first ground pattern portion 11a is formed to extend from the power semiconductor module 11 toward the connector 7. In the second region $A_2$, the second ground pattern portion 12a is formed to extend from the microcomputer 12 toward the connector 7, and is separated from the first ground pattern portion 11a. The first ground pattern portion 11a and the second ground pattern portion 12a are connected to each other only by the connection portion 20 at a position which is located far from the microcomputer 12 than the power semiconductor module 11 (step S101/ground-pattern forming process).

Next, the power semiconductor module 11, the microcomputer 12, the magnetic-pole position detection sensor 13, etc., are mounted on the substrate 5 (step S102/component mounting process).

[Process of Forming Mold Stator 30]

A plurality of electromagnetic steel sheets are stacked together to form the stator core 3a (step S201). Next, the stator core 3a and the insulator 3b are molded integrally (step S202). Then, the winding 3c is wound around each slot formed by the stator core 3a and the insulator 3b to form the stator 3 (step S203).

Subsequently the substrate 5 on which the GND pattern is formed and individual components are mounted is attached to the stator 3 to form a stator assembly in which the stator 3, the substrate 5 and the connector 7 are formed integrally (step S204). Then, specifications of the winding 3c, specifications of the rotor magnet 2b of the rotor 2 and control parameters according with a target to which a rotation load is to be applied are written to the flash memory of the microcomputer 12 (step S205). Then, the stator 3 and the substrate 5 are integrally molded out of a mold resin to form the mold stator 30. That is, the substrate 5 including the driving circuit 110 and the stator 3 including the winding 3c are integrally molded out of a mold resin forming the housing 8 to form the mold stator 30 having an outer frame made of a mold resin (step S206).

[Process of Forming Rotor Assembly]

The rotor magnet 2b is formed (step S301). Then, the rotor magnet 2b, the sensor magnet 2c and the rotation shaft 1 are integrally molded out of resin to form the rotor 2 (step S302). Next, the output-side bearing 4a and the counter-output-side bearing 4b are press-fitted in the rotation shaft 1; and the rotor 2, the output-side bearing 4a and the counter-output-side bearing 4b are combined into a rotor assembly (step S303).

[Process of Forming Electric Motor 100]

The rotor assembly into which the rotor 2, the output-side bearing 4a and the counter-output-side bearing 4b are combined is inserted into the recessed portion formed at the mold stator 30. Then, the bracket 9 is fitted in the inner peripheral portion of the mold stator 30 to close the opening port of the recessed portion of the mold stator 30, thereby forming the electric motor 100 (step S401).

Next, the formed electric motor 100 is inspected. At this time, a phase shift between a magnetic-pole position and a magnetic-pole position detection signal, an overcurrent limit value, etc., are also measured (step S402). Then, the measured phase shift between the magnetic-pole position and the magnetic-pole position detection signal, the measured overcurrent limit value, etc., are written to the flash memory (step S403).

Measurement and writing processes including the processes of steps S402 and S403 are performed only in the case where the microcomputer 12 includes a flash memory, which is rewritable after the electric motor 100 is manufactured, that is, in the case where the electric-power control device 10 has the flash rewrite function.

Then, in the case where the electric-power control device 10 has the flash rewrite function, the parameter writing process of step S205 may be performed at the same timing as a discrepancy-amount writing process of step S403. Although the parameter writing process of step S205 may be performed on the substrate before the discrepancy-amount writing process, in the case where the parameter writing process of step S205 is performed at the same timing as the discrepancy-amount writing process, of step S403, the substrate 5, etc., can be also applied to other types of electric motors. Therefore, it is possible to reduce the number of substrates which could remain as stocks.

Furthermore, in embodiment 1, the method for manufacturing the electric motor 100 is described above in the order of signs in FIG. 6. However, the order is not limited to this. For example, a process of mounting element onto the substrate 5 (steps S101 and S102) and processes up to the process of forming the stator 3 (steps S201 to S203) can be performed concurrently. Furthermore, the process of forming the mold stator 30 (steps S201 to S206) and the process of forming the rotor assembly (steps S301 to S303) can be performed concurrently.

As described above, in the electric-power control device 10, the first ground pattern portion 11a connected to the ground terminal of the power semiconductor module 11 and the second ground pattern portion 12a connected to the ground terminal of the microcomputer 12 are provided in different regions at the substrate 5. Therefore, the distance between the ground terminal of the power semiconductor module 11 and the ground terminal of the microcomputer 12, which are provided, with the GND patterns interposed between these ground terminals, is long. Furthermore, in the electric-power control device 10, in the power semiconductor module 11 and the microcomputer 12, respective GND patterns are provided. Thus, each of the GND patterns can be narrowed without increasing noise, as compared with the case of providing a single GND pattern which is shared between the power semiconductor module 11 and the microcomputer 12. Therefore, in the electric-power control device 10, heat generated by the power semiconductor module 11 is not easily transmitted to the microcomputer 12 through the ground electrode. It is therefore possible to reduce raising of the temperature of the microcomputer.

Furthermore, as illustrated in FIG. 4, the electric-power control device 10 can be configured such that the distance between the connection portion 20 and the connector 7 is shorter than that between the through hole 5a and the connector 7. In the electric-power control device 10 having the above configuration, the distance between the microcomputer 12 and the connection portion 20 is sufficiently long. Therefore, transmission of heat generated at the power semiconductor module 11 to the microcomputer 12 can be further reduced, thus further reducing raising of the temperature of the microcomputer 12.

In addition, in the case where the substrate 5 is integrally molded out of resin, heat generated at the power semiconductor module 11 is transferred via the resin from the GND pattern which is formed to be long and to include divided pattern portions. Therefore, transmission of heat from the power semiconductor module 11 to the microcomputer 12 can be further reduced. In addition, the reliability of the electric motor 100 including the electric-power control device 10 can be improved.

Furthermore, in the example of FIGS. 3 and 4, the electric-power control device 10 is configured such that the distance between the microcomputer 12 and the connector 7 is longer than that between the through hole 5a and the connector 7. That is, the second ground pattern portion 12a which is longer than the distance between the through hole 5a and the connector 7 is formed at the substrate 5 of the electric-power control device 10, as a result of which the length of the ground electrode from the microcomputer 12 to the connection portion 20 is sufficiently long, and raising of the temperature of the microcomputer 12 can be further reduced.

Unlike dedicated ICs such as application specific integrated circuits (ASICs) or application specific standard products (ASSPs), microcomputers have a large circuit scale and a high clock frequency, and thus operate at high speed. It is therefore hard to increase the guaranteed temperature of microcomputers, and it requires a high cost to increase the guaranteed temperature. Thus, the highest operation guaranteed temperature is low, as compared with the dedicated ICs. For example, in the case where the highest operation guaranteed temperature of a dedicated IC is 115 degrees Celsius, the highest operation guaranteed temperature of a microcomputer is approximately 85 degrees Celsius, which is lower than 115 degrees Celsius. This is more remarkable in the case where the microcomputer incorporates a flash memory which requires a specific process. In this regard, since the electric-power control device 10 adopts the above configuration, raising of the temperature of the microcomputer 12 can be reduced, as a result of which a high-speed operation of the microcomputer 12 can be achieved effectively without increasing the highest operation guaranteed temperature.

Furthermore, in the electric-power control device 10, since raising of the temperature of the microcomputer 12 can be reduced, the following advantages can be obtained. Firstly, in the electric-power control device 10, the microcomputer 12 having a low heat resistance can be used, and as a result the cost can be reduced. Furthermore, in the electric-power control device 10, since the microcomputer 12 can be operated at a high speed, it is possible to achieve a complicated motor control, and improve the performance of the electric motor 100, for example, it is possible to increase the efficiency thereof, reduce noise, and increase the maximum output of the electric motor 100. In addition, it is possible to increase the maximum output, which would be restricted to reduce raising of the temperature of the microcomputer 12, that is, raising of the temperatures of the power semiconductor module 11 and the winding 3c.

Furthermore, in the case where the microcomputer 12 includes a flash memory and a dedicated lead wire for use in transmission of a signal for rewriting data stored in the flash memory, the data in the flash memory can be rewritten via the dedicated lead wire.

Figure 16:
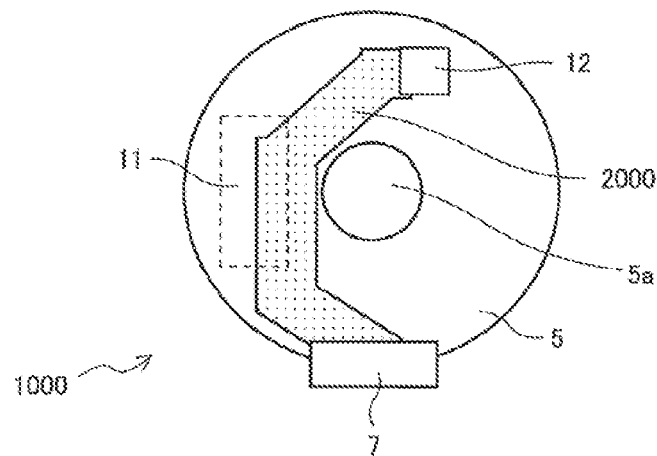
FIG. 16 is a schematic view illustrating a configuration of a conventional electric-power control device that includes a power semiconductor module of a lead type as the electric-power control device is viewed from a stator side.
Figure 17:
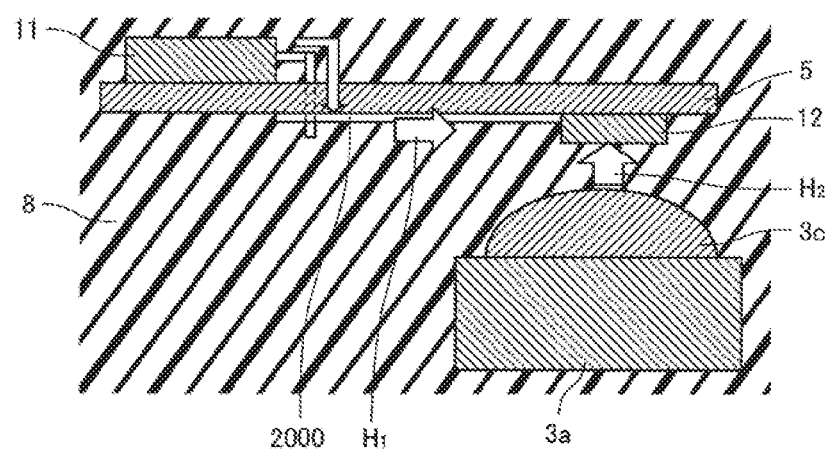
FIG. 17 is an explanatory view illustrating how heat is transmitted to a microcomputer in the electric-power control device as illustrated in FIG. 16.

FIG. 16 is a schematic view illustrating a configuration of a conventional electric-power control device which includes a lead type of power semiconductor module, as the electric-power control device is viewed from a stator side. FIG. 17 is an explanatory view illustrating how heat is transmitted to a microcomputer in the electric-power control device as illustrated in FIG. 16. Advantages obtained by the electric-power control device 10 and the electric motor 100 according to embodiment 1 will be explained further in detail in comparison with a comparative example as illustrated in FIGS. 16 and 17. As a matter of convenience, components which are the same as or similar to those of the electric-power control device 10 will be denoted by the same signs.

In an electric-power control device 1000, as illustrated in FIG. 16, a ground terminal of the power semiconductor module 11 and a ground terminal of the microcomputer 12 are connected by a GND pattern 2000 formed as a single solid pattern. The GND pattern 2000 is formed of copper foil or the like to have a great thickness, and located on the shortest path between the power semiconductor module 11 and the microcomputer 12. Therefore, as indicated by outlined arrow $H_1$ in FIG. 17, heat generated at the power semiconductor module 11 is directly transmitted to the microcomputer 12 via the GND pattern 2000, thus raising the temperature of the microcomputer 12. Furthermore, in the case where the stator 3 and the substrate 5 are integrally molded out of a mold resin, heat generated at the winding 3c is also transmitted to the microcomputer 12 via the mold resin, as indicated by outlined arrow $H_2$ in FIG. 17, and the temperature of the microcomputer 12 is raised more remarkably. That is, in general, the microcomputer 12 hardly generates heat by itself, and heat from the power semiconductor module 11 and the winding 3c is a main factor in raising of the temperature of the microcomputer 12.

In the electric-power control device 10 according to embodiment 1, a GND pattern is separated into the first ground pattern portion 11a connected to the ground terminal of the power semiconductor module 11 and the second ground pattern portion 12a connected to the ground terminal of the microcomputer 12. In addition, in the electric-power control device 10, the first ground pattern portion 11a and the second ground pattern portion 12a are connected at a position which is located further from the microcomputer 12 than the power semiconductor module 11, and for example, the connection portion 20 is located opposite to the microcomputer 12 with respect to the through hole 5a. That is, in the electric-power control device 10, the length of the GND pattern from the power semiconductor module 11 to the microcomputer 12 is long and the width of the GND pattern is small, as compared with the conventional configuration. Therefore, heat generated at the power semiconductor module 11 is not easily transmitted to the microcomputer 12, and raising of the temperature of the microcomputer 12 can thus be reduced.

Furthermore, in the electric motor 100 according to embodiment 1, the stator 3 and the substrate 5 are integrally molded out of a mold resin, and transmission of heat from the power semiconductor module 11 to the microcomputer 12 is reduced. Therefore, the restrictions for reducing raising of the temperature of the winding 3c can be relaxed, and the maximum output of the electric motor 100 can thus be increased.

<Modification 1>

Figure 7:
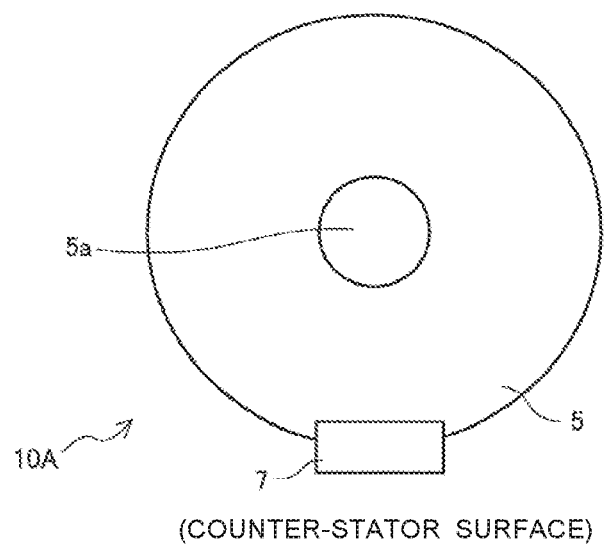
FIG. 7 is a schematic view illustrating a configuration of an electric-power control device according to modification 1 of embodiment 1 of the present invention as the electric-power control device is viewed from a counter-stator side.
Figure 8:
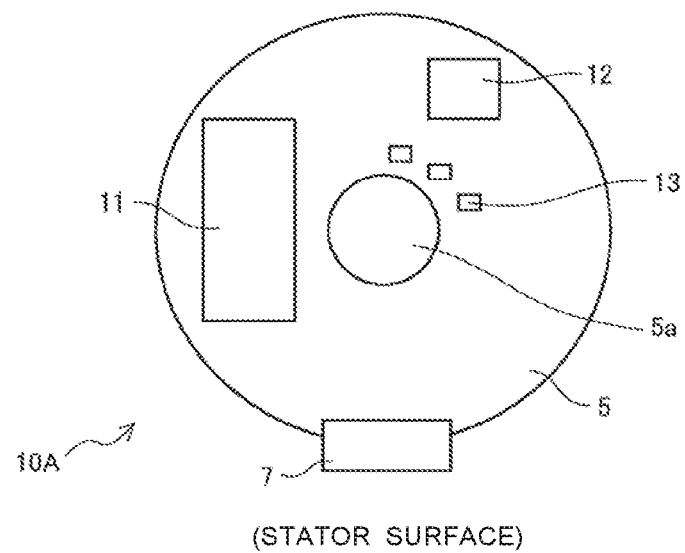
FIG. 8 is a schematic view illustrating a configuration of the electric-power control device according to modification 1 of embodiment 1 of the present invention as the electric-power control device is viewed from a stator side.
Figure 9:
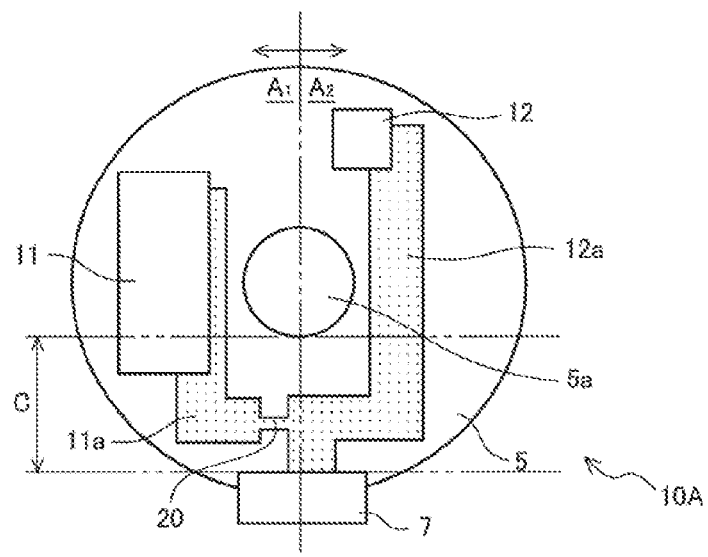
FIG. 9 is a schematic diagram illustrating an example of the electric-power control device as illustrated in FIG. 8 including GND patterns provided at a substrate.

FIG. 7 is a schematic view illustrating a configuration of an electric-power control device according to modification 1 of embodiment 1 of the present invention as the electric-power control device is viewed from a counter-stator side. FIG. 8 is a schematic view Illustrating a configuration of the electric-power control device according to modification 1 of embodiment 1 of the present invention as the electric-power control device is viewed from a stator side. FIG. 9 is a schematic diagram illustrating an example of the electric-power control device as illustrated in FIG. 8, along with GND patterns provided at a substrate. The electric motor 100 according to modification 1 includes an electric-power control device 10A in place of the electric-power control device 10. A configuration of the electric-power control device 10A will be described with reference to FIGS. 7 to 9. Components which are the same as or similar to those of the electric-power control device 10 will be referred to with the same signs, and their descriptions will thus be omitted.

As illustrated in FIGS. 7 and 8, the microcomputer 12 and the magnetic-pole position detection sensor 13 are mounted on a stator surface 5n of the substrate 5. Furthermore, passive components (not illustrated) such as a resistor and a capacitor are arranged on the stator surface 5n of the substrate 5. The electric-power control device 10A according to modification 1 employs a surface-mount type of power semiconductor module 11, and the power semiconductor module 11 is also mounted on the stator surface 5n of the substrate 5. The power semiconductor module 11 can be mounted by a single surface reflow.

Figure 18:
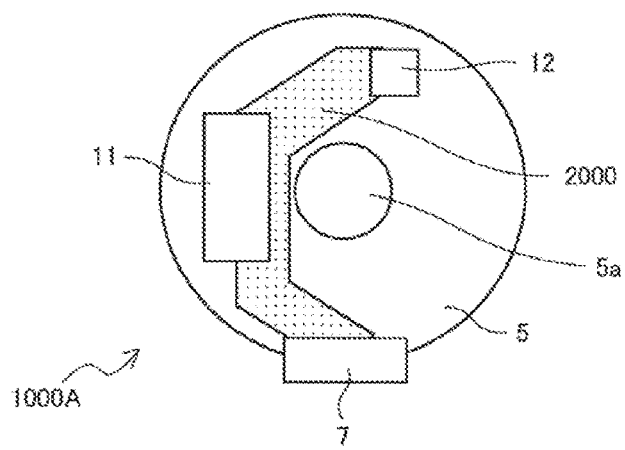
FIG. 18 is a schematic view illustrating a configuration of a conventional electric-power control device that includes a power semiconductor module of a surface-mount type as the electric-power control device is viewed from a stator side.
Figure 19:
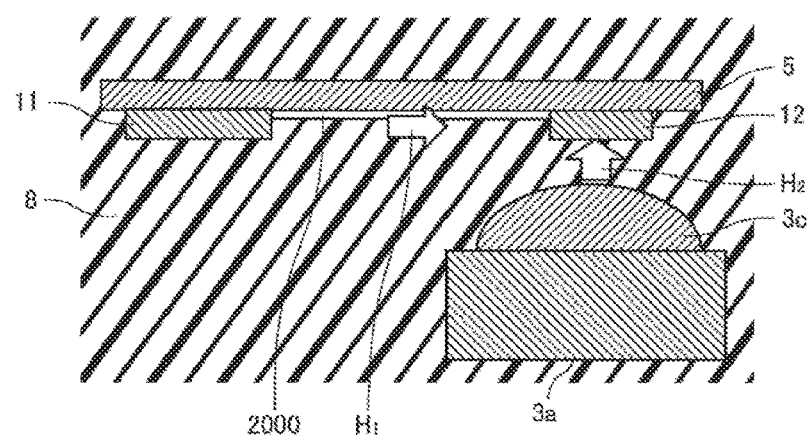
FIG. 19 is an explanatory view illustrating how heat is transmitted to a microcomputer in the electric-power control device as illustrated in FIG. 18.

FIG. 18 is a schematic view illustrating a configuration of a conventional electric-power control device that includes a power semiconductor module of a surface-mount type as the electric-power control device is viewed from a stator side. FIG. 19 is an explanatory view illustrating how heat is transmitted to a microcomputer in the electric-power control device as illustrated in FIG. 18. Advantages obtained by the electric-power control device 10A according to this modification will be explained below with reference to a comparative example as illustrated in FIGS. 18 and 19. Components which are the same as or similar to those of the electric-power control device 1000 will be denoted by the same signs, and their descriptions will thus be omitted.

In an electric-power control device 1000A, a ground terminal of the power semiconductor module 11 and a ground terminal of the microcomputer 12 are connected by the GND pattern 2000, as illustrated in FIG. 18. Therefore, as indicated by outlined arrow H$_1$ in FIG. 19, heat generated at the power semiconductor module 11 is directly transmitted to the microcomputer 12 via the GND pattern 2000, and the temperature of the microcomputer 12 thus rises. Furthermore, in the case where the stator 3 and the substrate 5 are integrally molded out of a mold resin, as indicated by outlined arrow H$_2$ in FIG. 19, heat generated at the winding 3c is also transmitted to the microcomputer 12 via the mold resin. Therefore, the temperature of the microcomputer 12 rises more remarkably.

In the electric-power control device 10A according to modification 1, the first ground pattern portion 11a and the second ground pattern portion 12a are connected by the connection portion 20 at a position which is located further from the microcomputer 12 than the power semiconductor module 11. That is, in the electric-power control device 10A, the length of the GND pattern from the power semiconductor module 11 to the microcomputer 12 is long and the width of the GND pattern is small as in the electric-power control device 10, as compared with the conventional configuration. Therefore, in the electric-power control device 10A, transmission of heat generated at the power semiconductor module 11 to the microcomputer 12 can be reduced, and raising of the temperature of the microcomputer 12 can thus be reduced. Furthermore, in the electric motor 100 in which the electric-power control device 10A is provided, the restrictions for reducing raising of the temperature of the winding 3c can be relaxed, and the maximum output of the electric motor 100 can thus be increased.

<Modification 2>

Figure 10:
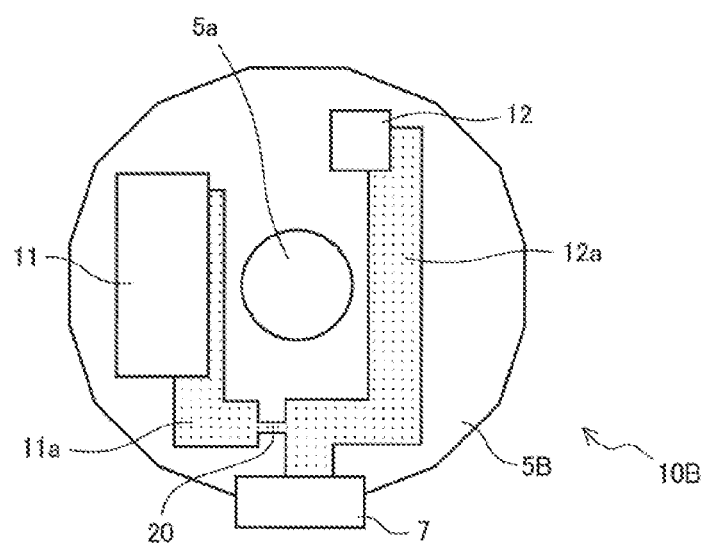
FIG. 10 is a schematic view illustrating a configuration of an electric-power control device according to modification 2 of embodiment 1 of the present invention.

FIG. 10 is a schematic view illustrating a configuration of an electric-power control device according to modification 2 of embodiment 1 of the present invention. The electric motor 100 according to modification 2 includes an electric-power control device 10B in place of the electric-power control device 10. A configuration of the electric-power control device 10B will be explained with reference to FIG. 10. Components which are the same as or similar to those of the electric-power control devices 10 and 10A will be denoted by the same signs, and their descriptions will thus be omitted.

The electric-power control device 10B includes a substrate 5B whose outer periphery is formed in a polygon, in place of the substrate 5. FIG. 10 illustrates an example of the substrate 5B whose outer periphery is a regular hexadecagon. The substrate 5B is configured in the same manner as the substrate 5 except that its outer periphery is a polygon. That is, the other configuration features of the electric-power control device 10B are the same as those of the electric-power control device 10A. Also, in the electric-power control device 10B configured in the above manner, advantages which are the same as or similar to those of the electric-power control device 10A can be obtained.

In the example as illustrated in FIG. 10, the outer periphery of the substrate 5B is a regular hexadecagon, however, it is not limited to this shape. That is, the outer periphery of the substrate 5B may be formed in an arbitrary polygon having three or more vertices. Furthermore, in the electric-power control device 10B, the power semiconductor module 11 may be mounted on the counter-stator surface 5m of the substrate 5B, as in the electric-power control device 10.

<Modification 3>

Figure 11:
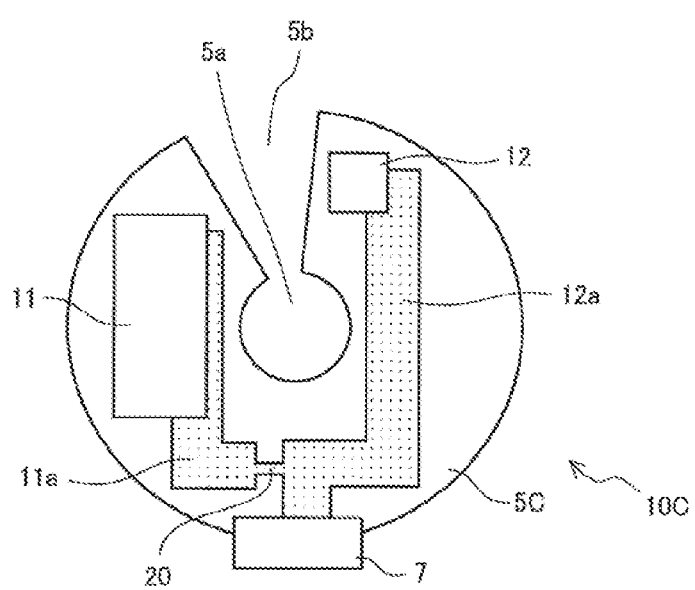
FIG. 11 is a schematic view illustrating a configuration of an electric-power control device according to modification 3 of embodiment 1 of the present invention.

FIG. 11 is a schematic view illustrating a configuration of an electric-power control device according to modification 3 of embodiment 1 of the present invention. The electric motor 100 according to modification 3 includes an electric-power control device 10C in place of the electric-power control device 10. A configuration of the electric-power control device 10C will be explained with reference to FIGS. 1 and 11. Components which are the same as or similar to those of the electric-power control devices 10 and 10A will be denoted by the same signs, and their descriptions will thus be omitted.

The electric-power control device 10C includes a substrate 5C which is annularly formed such that part thereof is cut out from its outer periphery to its inner periphery. To be more specific, as illustrated in FIG. 11, the substrate 5C has the through hole 5a and a notch portion 5b. That is, in the substrate 5C, part thereof which is located opposite to the connector 7 with respect to the through hole 5a and also located between the power semiconductor module 11 and the microcomputer 12 is partially cut out from the outer periphery of the substrate 5C to the inner periphery thereof. The substrate 5C is configured in the same manner as the substrate 5 except that the above part of the substrate 5C is cut out. That is, the other configuration features of the electric-power control device 10C are the same as those of the electric-power control device 10A.

As described above, in the electric-power control device 10C, resin or another material which forms the substrate 5C is not located on the shortest path between the power semiconductor module 11 and the microcomputer 12, and transmission of heat from the power semiconductor module 11 to the microcomputer 12 can thus be reduced more accurately. With respect to modification 3, the case where the substrate 5C has the notch portion 5b is illustrated as an example. However, the configuration of the substrate 5C is not limited to this. For example, part of the outer periphery or inner periphery of the substrate 5C that is located opposite to the connector 7 with respect to the through hole 5a and also located between the power semiconductor module 11 and the microcomputer 12 may be cut out, or one or more holes may be provided in the above part.

In the electric-power control device 10C, the power semiconductor module 11 may be mounted on the counter-stator surface 5m of the substrate 5C, as in the electric-power control device 10. Furthermore, the substrate 5C may be formed to have a polygonal outer periphery, as well as the substrate 5B.

Embodiment 2

Figure 12:
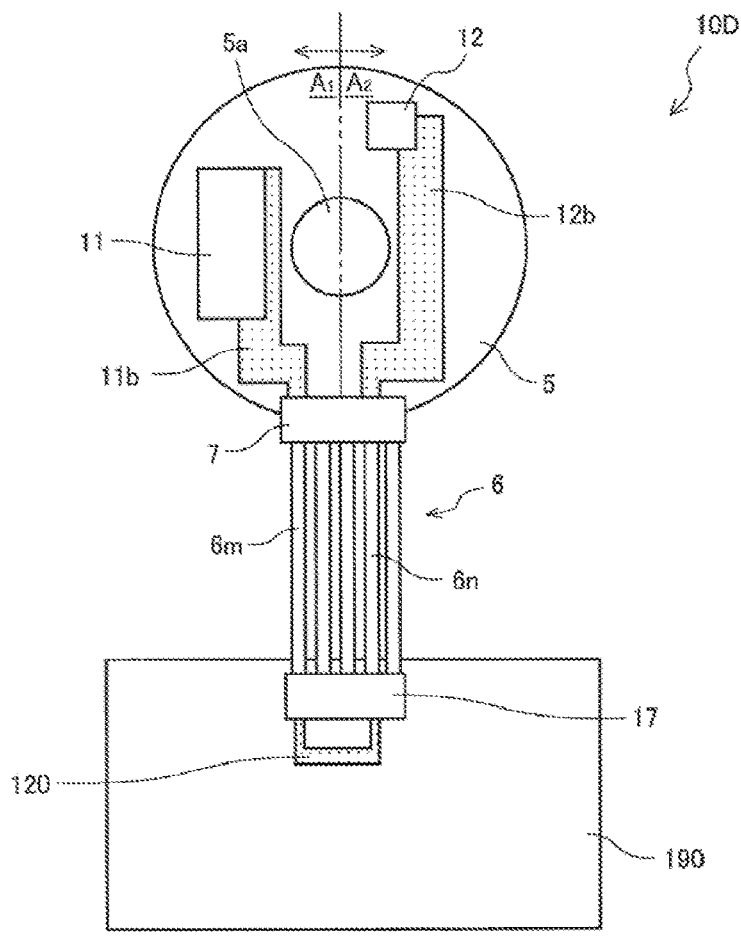
FIG. 12 is a schematic view illustrating a configuration of an electric-power control device according to embodiment 2 of the present invention.

FIG. 12 is a schematic view illustrating a configuration of an electric-power control device according to embodiment 2 of the present invention. The electric motor 100 according to embodiment 2 includes an electric-power control device 10D in place of the electric-power control device 10. A configuration of the electric-power control device 10D according to embodiment 2 will be explained with reference to FIG. 12. Components which are the same as or similar to those in embodiment 1 described above will be denoted by the same signs, and their descriptions will thus be omitted.

At the substrate 5 of the electric-power control device 10D, a first ground pattern portion 11b is connected to a ground terminal of the power semiconductor module 11, and a second ground pattern portion 12b is connected to the microcomputer 12. The lead wire 6 included in the electric-power control device 10D includes: a first lead wire 6m which is provided for the GND of the power semiconductor module 11 and connected to the first ground pattern portion 11a; and a second lead wire 6n which is provided for the GND of the microcomputer 12 and connected to the second ground pattern portion 12b. In the example of FIG. 12, the connector 7 is provided opposite to the microcomputer 12 with respect to the through hole 5a.

The first ground pattern portion 11b is formed in the first region $A_1$ in such a way as to extend from the power semiconductor module 11 toward the connector 7. That is, the first ground pattern portion 11b is located opposite to the microcomputer 12 with respect to the through hole 5a, and extends from the power semiconductor module 11 toward the connector 7. The first ground pattern portion 11b is connected to the first lead wire 6m by the connector 7.

The second ground pattern portion 12b is formed in the second region $A_2$ in such a way as to extend from the microcomputer 12 toward the connector 7. That is, the second ground pattern portion 12b is located opposite to the power semiconductor module 11 with respect to the through hole 5a, and extends from the microcomputer 12 toward the connector 7. The second ground pattern portion 12b is connected to the second lead wire 6n by the connector 7.

The first lead wire 6m and the second lead wire 6n are individually connected to a connector 17 of an external substrate 190, and are connected to each other by a connection portion 120, which is a ground electrode formed at the external substrate 190. That is, the connection portion 120 is provided outside the substrate 5, and connects part of the first ground pattern portion 11b which is located at the connector 7 and part of the second ground pattern portion 12b which is located at the connector 7, with the first lead wire 6m and the second lead wire 6n interposed between the connection portion 120 and the above parts of the first ground pattern portion 11b and the second ground pattern portion 12b. In the example of FIG. 12, the connection portion 120 is formed narrower than the first ground pattern portion 11b and the second ground pattern portion 12b. The external substrate 190 is, for example, a control substrate of an apparatus incorporating the electric motor 100. The other configuration features of the electric-power control device 10D are the same as those of the electric-power control device 10A according to embodiment 1 described above. Furthermore, a method for manufacturing the electric motor 100 including the electric-power control device 10D is the same as that in the case illustrated in FIG. 6.

As described above, in the electric-power control device 10D, the first ground pattern portion 11b and the second ground pattern portion 12b are connected to each other outside the substrate 5, and a connection path between the ground terminal of the power semiconductor module 11 and the ground terminal of the microcomputer 12 is therefore longer than that in embodiment 1 as described above. Thus, in the electric-power control device 10D, the amount of heat transmitted from the power semiconductor module 11 to the microcomputer 12 via a ground electrode can be further reduced.

Furthermore, the first lead wire 6m and the second lead wire 6n are connected to each other by the connector 17 and the connection portion 120 provided at the external substrate 190. Therefore, transmission of heat from the power semiconductor module 11 to the microcomputer 12 can be reduced, as compared with the case where the first lead wire 6m and the second lead wire 6n are connected together without a solid pattern.

Furthermore, as illustrated in FIG. 12, the connection portion 120 can be formed narrower than the first ground pattern portion 11b and the second ground pattern portion 12b. As a result, in the electric-power control device 10D, transmission of heat from the first lead wire 6m to the second lead wire 6n can be hindered by the connection portion 120. Therefore, transmission of heat generated at the power semiconductor module 11 to the microcomputer 12 can be reduced more accurately.

With respect to embodiment 2, it is described above by way of example that the first lead wire 6m and the second lead wire 6n are connected by the connection portion 120 formed at the external substrate 190. However, it suffices that the first lead wire 6m and the second lead wire 6n are connected to each other outside the substrate 5; that is, the first lead wire 6m and the second lead wire 6n may be connected to each other without a solid pattern.

In the electric-power control device 10D, the power semiconductor module 11 may be mounted on the counter-stator surface 5m of the substrate 5 as in the electric-power control device 10. Furthermore, the substrate 5 of the electric-power control device 10D may be formed to have a polygonal outer periphery, as well as the substrate 5B. Furthermore, the substrate 5 of the electric-power control device 10D may be formed in such a way as to be partially cut out, as well as the substrate 5C.

Embodiment 3

Figure 13:
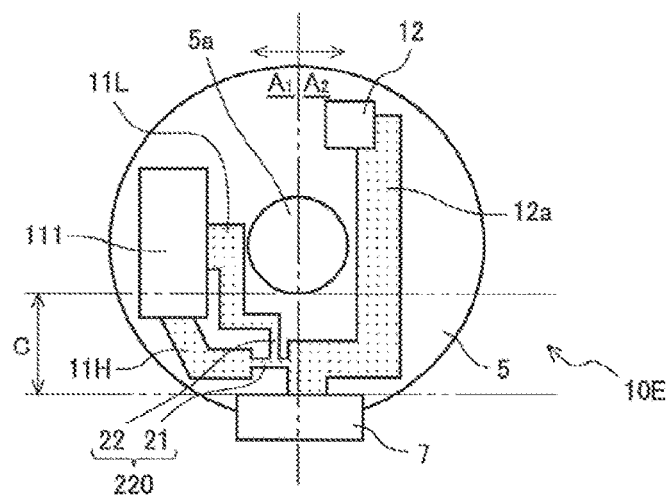
FIG. 13 is a schematic view illustrating a configuration of an electric-power control device according to embodiment 3 of the present invention.
Figure 14:
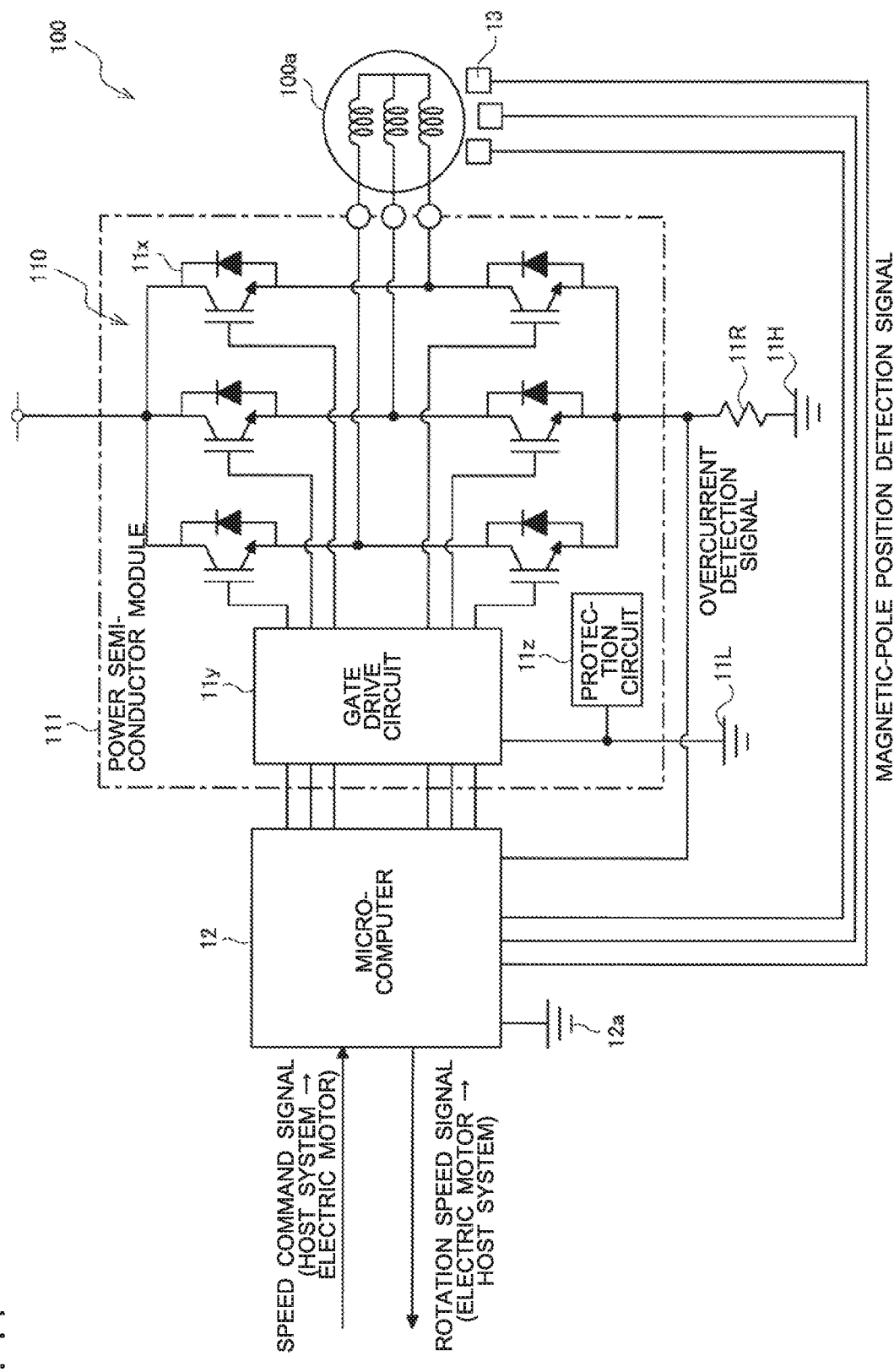
FIG. 14 is a circuit view illustrating an example of a circuit configuration of the electric-power control device as illustrated in FIG. 13.

FIG. 13 is a schematic view illustrating a configuration of an electric-power control device according to embodiment 3 of the present invention. FIG. 14 is a circuit diagram illustrating an example of a circuit configuration of the electric-power control device as illustrated in FIG. 13. A configuration of an electric-power control device 10E according to embodiment 3 will be explained with reference to FIGS. 13 and 14. Components which are the same as or similar to those in embodiments 1 and 2 as described above will be denoted by the same signs, and their descriptions will thus be omitted.

As illustrated in FIG. 14, the electric-power control device 10E includes a power semiconductor module 111 which includes the driving circuit 110, which is a high-pressure circuit, and low-pressure circuits such as the gate drive circuit 11y and the protection circuit 11z. The power semiconductor module 111 includes two ground terminals. In embodiment 3, the power semiconductor module 111 includes, as separate pins, a ground terminal of a high-pressure portion for the GND of the individual power transistors 11x and a ground terminal of a low-pressure portion for the GND of the low-pressure circuits such as the gate drive circuit 11y and the protection circuit 11z.

As illustrated in FIG. 13, a first high-pressure ground pattern portion 11H and a first low-pressure ground pattern portion 11L are formed at the substrate 5 of the electric-power control device 10E. The first high-pressure ground pattern portion 11H is a ground electrode connected to the ground terminal of the high-pressure portion of the power semiconductor module 111. The first low-pressure ground pattern portion 11L is a ground electrode which is separated from the first high-pressure ground pattern portion 11H, and which is connected to the ground terminal of the low-pressure portion of the power semiconductor module 111. Also, the second ground pattern portion 12a is formed at formed at the substrate 5 of the electric-power control device 10E. The second ground pattern portion 12a is a ground electrode which is separated from the first high-pressure ground pattern portion 11H and the first low-pressure ground pattern portion 11L, and which is connected to the ground terminal of the microcomputer 12.

The first high-pressure ground pattern portion 11H and the first low-pressure ground pattern portion 11L are formed to extend from the power semiconductor module 111 toward the connector 7 in the first region A₁ such that the first high-pressure ground pattern portion 11H and the first low-pressure ground pattern portion 11L do not cross each other. That is, the first high-pressure ground pattern portion 11H and the first low-pressure ground pattern portion 11L are located opposite to the microcomputer 12 with respect to the through hole 5a, and extends from the power semiconductor module 111 toward the connector 7.

Furthermore, a connection portion 220 is formed at the substrate 5 of the electric-power control device 10E. The connection portion 220 is a ground electrode which connects part of the first high-pressure ground pattern portion 11H which is closer to the connector 7, part of the first low-pressure ground pattern portion 11L which is closer to the connector 7 and part of the second ground pattern portion 12a which is closer to the connector 7. The connection portion 220 is provided in the connection region C between the through hole 5a and the connector 7. That is, the first high-pressure ground pattern portion 11H, the first low-pressure ground pattern portion 11L, and the second ground pattern portion 12a are connected only by the connection portion 220 in the connection region C. In the example of FIG. 13, the distance between the connection portion 220 and the connector 7 is shorter than that between the through hole 5a and the connector 7.

In the example of FIG. 13, the connection portion 220 is provided opposite to the microcomputer 12 with respect to the through hole 5a. In the example of FIG. 13, the connection portion 220 is a ground electrode, and includes a third high-pressure ground pattern portion 21 which connects the first high-pressure ground pattern portion 11H and the second ground pattern portion 12a to each other, and a third high-low ground pattern portion 22 which connects the third high-pressure ground pattern portion 21 and the first low-pressure ground pattern portion 11L to each other. The other configuration features of the electric-power control device 10E are the same as those of the electric-power control device 10A according to embodiment 1 as described above. A method for manufacturing the electric motor 100 including the electric-power control device 10E is the same as that in the case as illustrated in FIG. 6.

As described above, in the electric-power control device 10E, the first high-pressure ground pattern portion 11H, the first low-pressure ground pattern portion 11L, and the second ground pattern portion 12a are separately provided on the substrate 5, and the first high-pressure ground pattern portion 11H, the first low-pressure ground pattern portion 11L and the second ground pattern portion 12a are connected by the connection portion 220 in the connection region C. Therefore, in the electric-power control device 10E, the length of the GND pattern from the power semiconductor module 111 to the microcomputer 12 can be increased. Thus, heat transmission from the power semiconductor module 111 to the microcomputer 12 can be reduced. Therefore, the electric motor 100 including the electric-power control device 10E can have a higher reliability. Furthermore, as illustrated in FIG. 13, the electric-power control device 10E can be configured such that the distance between the connection portion 220 and the connector 7 is shorter than the distance between the through hole 5a and the connector 7. In the electric-power control device 10E having such a configuration, the distance between the microcomputer 12 and the connection portion 220 is sufficiently long. Therefore, transmission of heat generated at the power semiconductor module 111 to the microcomputer 12 can be further reduced, and raising of the temperature of the microcomputer 12 can be further reduced.

Figure 20:
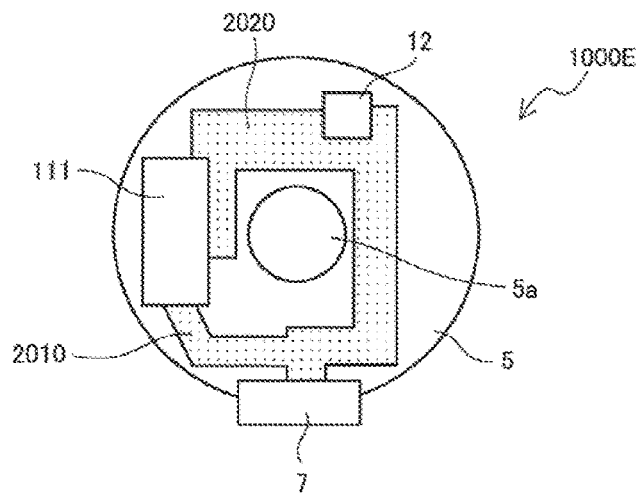
FIG. 20 is a schematic view illustrating a configuration of an electric-power control device provided in a conventional electric motor as the electric-power control device is viewed from a stator side.

FIG. 20 is a schematic view illustrating a configuration of an electric-power control device provided in a conventional electric motor as the electric-power control device is viewed from a stator side. Advantages obtained by the electric-power control device 10E according to embodiment 3 will be described in further detail in comparison with a comparative example as Illustrated in FIG. 20. As a matter of convenience, components which are the same as or similar to those of the electric-power control device 10E will be denoted by the same signs.

In an electric-power control device 1000E, in order to eliminate noise from a high-pressure portion, the GND pattern of the substrate 5 is formed in such a way as to include separate GND patterns: a GND pattern 2010 for the GND of the high-pressure portion of the power semiconductor module 111; and a GND pattern 2020 for the GND of the low-pressure portion of the power semiconductor module 111 and the microcomputer 12. Furthermore, the GND patter 2020 is formed shorter and wider than, for example, a copper solid pattern. Thereby, in the electric-power control device 1000E, the impedance between the ground terminal of the low-pressure portion of the power semiconductor module 111 and the ground terminal of the microcomputer 12 can be reduced, and noise tolerance is improved.

However, in the electric-power control device 1000E, the short and wide GND pattern 2020 is formed on the shortest path between the power semiconductor module 111 and the microcomputer 12. Therefore, heat generated at the power semiconductor module 111 is transmitted directly to the microcomputer 12 via the GND pattern 2020, thus raising the temperature of the microcomputer 12. Furthermore, in the case where the stator 3 and the substrate 5 are integrally molded out of resin, heat generated at the winding 3c is transmitted to the microcomputer 12 via the resin, and the temperature of the microcomputer 12 thus rises more remarkably.

In the electric-power control device 10E according to modification 3, the GND pattern of the substrate 5 is formed in such a way as to include separate portions: the first high-pressure ground pattern portion 11H; the first low-pressure ground pattern portion 11L; the second ground pattern portion 12a, and the connection portion 220. That is, the first high-pressure ground pattern portion 11H, the first low-pressure ground pattern portion 11L, and the second ground pattern portion 12a, which are separately provided, are connected by the connection portion 220 at a position which is located further from the microcomputer 12 than the power semiconductor module 111. Therefore, heat generated at the power semiconductor module 111 is not easily transmitted to the microcomputer 12, as a result of which raising of the temperature of the microcomputer 12 can be reduced.

Furthermore, the connection portion 220 is formed narrower than the first high-pressure ground pattern portion 11H, the first low-pressure ground pattern portion 11L, and the second ground pattern portion 12a. Therefore, in the electric-power control device 10, transmission of heat from the power semiconductor module 111 to the second ground pattern portion 12a can be hindered by the connection portion 220. Thus, transmission of heat from the power semiconductor module 111 to the microcomputer 12 can be further reduced.

In the electric-power control device 10E, the power semiconductor module 111 may be mounted on the counter-stator surface 5m of the substrate 5 as in the electric-power control device 10. Furthermore, the electric-power control device 10E may include the substrate 5B having a polygonal outer periphery in place of the substrate 5. Furthermore, the electric-power control device 10E may include the substrate 5C which is formed in such a way as to be partially cut out, in place of the substrate 5. Arrangement of the first high-pressure ground pattern portion 11H and the first low-pressure ground pattern portion 11L may be changed in accordance with the location of the ground terminal in the power semiconductor module 111. For example, in the case where in the power semiconductor module 111, the ground terminal of the high-pressure portion and the ground terminal of the low-pressure portion are interchanged, it suffices that the first high-pressure ground pattern portion 11H and the first low-pressure ground pattern portion 11L are interchanged.

Moreover, in the electric-power control device 10E, only the first high-pressure ground pattern portion 11H, the first low-pressure ground pattern portion 11L and the second ground pattern portion 12a may be formed on the substrate 5 as in the electric-power control device 10D. In addition, the lead wire 6 of the electric-power control device 10E may include a first high-pressure lead wire connected to the first high-pressure ground pattern portion 11H, a first low-pressure lead wire connected to the first low-pressure ground pattern portion 11L and a second lead wire connected to the second ground pattern portion 12a. The first high-pressure lead wire, the first low-pressure lead wire and the second lead wire may be connected to each other outside the substrate 5. The first high-pressure ground pattern portion 11H and the first low-pressure ground pattern portion 11L may be connected to each other by, for example, a solid pattern on the substrate 5. In this case, the lead wire 6 of the electric-power control device 10E has only to include a first lead wire connected to the first high-pressure ground pattern portion 11H and the first low-pressure ground pattern portion 11L and a second lead wire connected to the second ground pattern portion 12a. The first lead wire and the second lead wire may be connected to each other outside the substrate.

Embodiment 4

Figure 15:
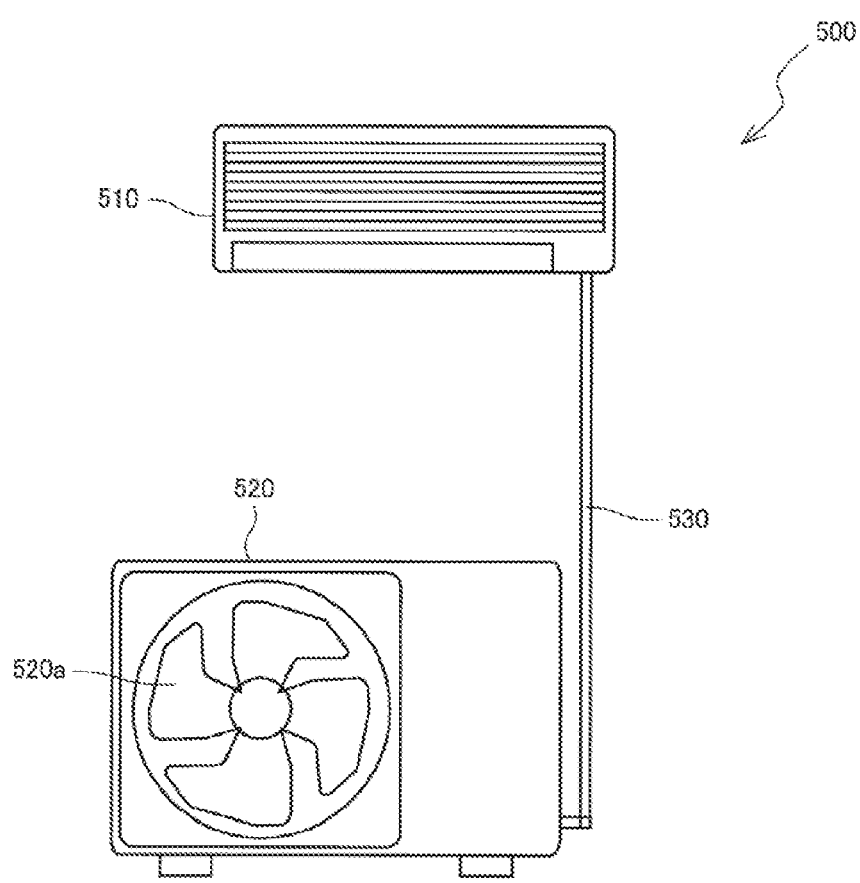
FIG. 15 is a schematic view illustrating an example of a configuration of an air-conditioning apparatus according to embodiment 4 of the present invention.

FIG. 15 is a schematic view illustrating an example of a configuration of an air-conditioning apparatus according to embodiment 4 of the present invention. As illustrated in FIG. 15, an air-conditioning apparatus 500 includes an indoor unit 510 and an outdoor unit 520. The indoor unit 510 and the outdoor unit 520 are connected to each other by a refrigerant pipe 530. The indoor unit 510 includes: an expansion valve, for example, an electronic expansion valve, that decompresses refrigerant; and an indoor heat exchanger, for example, a fin-and-tube-type heat exchanger, that causes heat exchange to be performed between refrigerant and indoor air, although these components are not illustrated. The indoor heat exchanger functions as an evaporator during a cooling operation and functions as a condenser during a heating operation.

The outdoor unit 520 includes: a compressor, for example, a hermetic compressor, that compresses refrigerant; and an outdoor heat exchanger, for example, a fin-and-tube-type heat exchanger, that causes heat exchange to be performed between refrigerant and outside air, although these components are not illustrated. The outdoor heat exchanger functions as a condenser during a cooling operation and functions as an evaporator during a heating operation. Furthermore, the outdoor unit 520 includes an outdoor-unit fan 520a, for example, an axial-flow fan such as a propeller fan, that sends air to the outdoor heat exchanger. The air-conditioning apparatus 500 incorporates the electric motor 100 as described with respect to embodiments 1 to 3, as a power source for the outdoor-unit fan 520a.

The indoor unit 510 may include an indoor-unit fan, for example, a centrifugal fan such as a cross flow fan, that sends air to the indoor heat exchanger. The air-conditioning apparatus 500 may include the electric motor 100 according to each of embodiments 1 to 3 as a power source for the indoor-unit fan. Furthermore, although FIG. 15 illustrates by way of example the air-conditioning apparatus 500 which is of a separate type and in which the indoor unit 510 and the outdoor unit 520 are provided separately, the air-conditioning apparatus 500 according to embodiment 4 may be provided as an integrated air-conditioning apparatus having a combination of the function of an indoor unit and that of an outdoor unit. That is, in the air-conditioning apparatus 500, it suffices that a compressor, a condenser, an expansion valve and an evaporator are connected by pipes to provide a refrigeration cycle in which refrigerant is circulated. In the case where the air-conditioning apparatus 500 includes a fan which sends air to at least one of a condenser and an evaporator, preferably, the air-conditioning apparatus 500 should include the electric motor 100 as a power source for the fan.

Furthermore, the air-conditioning apparatus 500 may include the electric motor 100 according to each of embodiments 1 to 3 as a power source for a compressor provided in the outdoor unit 520. That is, the air-conditioning apparatus 500 may incorporate the electric motor 100 according to each of embodiments 1 to 3 as a power source for at least one of the outdoor-unit fan 520a, the indoor-unit fan and the compressor.

As described above, the air-conditioning apparatus 500 according to embodiment 4 includes as a power source the electric motor 100 according to each of embodiments 1 to 3 as described above. It is therefore possible to reduce raising of the temperature of the microcomputer 12 which controls power to be supplied to the motor main body 100a, and thus improve the reliability of the air-conditioning apparatus 500.

With respect to embodiment 4, it is described above by way of example that the electric motor 100 according to each of embodiments 1 to 3 is provided in an air-conditioning apparatus. The electric motor 100 is not limited to such a configuration. For example, the electric motor 100 may be provided as a power source for a ventilating fan, various household electrical appliances, a machine tool, or the like.

Each of the above embodiments is a preferred specific example of an electric-power control device and an electric motor. A technical scope of the present invention is not limited to a technical scope covering those devices. For example, although FIG. 4, FIGS. 9 to 11 and FIG. 13 illustrate by way of example the connection portion 20 or 120 which is provided between the through hole 5a and the connector 7, the arrangement of the connection portion is not limited to this. The arrangement of the connection portion 20 may be changed appropriately in accordance with the positions and sizes of the through hole 5a and the connector 7.

Also, with respect to embodiments 1 to 3, it is described by way of example that the second ground pattern portion 12a is connected to the connector 7. However, this is merely an example, and is not indispensable. That is, the first ground pattern portion 11a may be connected to the connector 7, and the second ground pattern portion 12a may be connected to the connector 7 by the connection portion 20 and the first ground pattern portion 11a.

Moreover, with respect to each of the above embodiments, a flash memory is illustrated as an example of a memory incorporated into the microcomputer 12. However, the memory is not limited to the flash memory. For example, the microcomputer 12 may include another type of nonvolatile memory such as an erasable programmable ROM (EPROM), an electrically EPROM (EEPROM), a ferroelectric memory (ferroelectric RAM) or a magnetoresistive RAM (MRAM), in place of the flash memory.

Although FIGS. 5 and 14 illustrate by way of example the driving circuit 110 corresponding to a three-phase AC power source, the driving circuit 110 is not limited to this. The driving circuit 110 may correspond to a single-phase AC power source. That is, the electric motor 100 may correspond to a single-phase AC power source.

REFERENCE SIGNS LIST 1 rotation shaft 2 rotor 2a rotor main body 2b rotor magnet
2c sensor magnet 3 stator 3a stator core 3b insulator 3c winding 4a output-side bearing 4b counter-output-side bearing 5, 5B, 5C substrate 5a through hole 5b notch portion 5m counter-stator face 5n stator face 6 lead wire 6m first lead wire
6n second lead wire 7, 17 connector 8 housing 8a inner-diameter portion 8b bearing supporting portion 9 bracket 10, 10A to 10E, 1000, 1000A, 1000E electric-power control device 11, 111 power semiconductor module 11H first high-pressure ground pattern portion 11L first low-pressure ground pattern portion 11R overcurrent detection resistor 11a, 11 b first ground pattern portion 11x power transistor 11y gate drive circuit
11z protection circuit 12 microcomputer 12a, 12b second ground pattern portion 13 magnetic-pole position detection sensor 14 winding terminal 20, 120, 220 connection portion 21 third high-pressure ground pattern portion 22 third high-low ground pattern portion 30 mold stator 100 electric motor 100a motor main body 110 driving circuit 190 external substrate 500 air-conditioning apparatus 510 indoor unit 520 outdoor unit 520a outdoor-unit fan 530 refrigerant pipe 2000, 2010, 2020 GND pattern $A_1$ first region $A_2$ second region C connection region

The invention claimed is:

1. An electric-power control device which drives an electric motor including a rotor into which a rotation shaft is inserted and a stator provided on an outer peripheral side of the rotor, the electric-power control device comprising:
    an annular substrate including a through hole through which the rotation shaft passes, the substrate being provided to face the rotor and the stator;
    a connector which is provided at a peripheral portion of the substrate, and to which a lead wire is connected;
    a power semiconductor module mounted on a first region which is one of sides of the substrate which are divided with respect to a straight line connecting a center of the through hole to a center of the connector, the power semiconductor module including a ground terminal and a driving circuit; and
    a microcomputer mounted on a second region which is an other of the sides of the substrate, the microcomputer including a ground terminal and being configured to control electric power to be supplied to the electric motor,
    on the substrate, a first ground pattern portion, a second ground pattern portion and a connection portion being provided,
    the first ground pattern portion being provided as a ground electrode which is connected to the ground terminal of the power semiconductor module, and formed to extend from the power semiconductor module toward the connector in the first region,
    the second ground pattern portion being provided as a ground electrode which is separated from the first ground pattern portion, connected to the ground terminal of the microcomputer, and formed to extend from the microcomputer toward the connector in the second region,
    the connection portion connecting part of the first ground pattern portion that is close to the connector and part of the second ground pattern portion that is close to the connector.

2. The electric-power control device of claim 1,
    wherein the connection portion is a ground electrode provided on the substrate, and
    wherein the connection portion is formed narrower than the first ground pattern portion and the second ground pattern portion.

3. The electric-power control device of claim 2, wherein the connection portion and the connector are separated from each other by a distance which is shorter than a distance between the through hole and the connector.

4. The electric-power control device of claim 1,
    wherein the lead wire includes
    a first lead wire connected to the first ground pattern portion, and
    a second lead wire connected to the second ground pattern portion, and
    wherein the connection portion is provided outside the substrate, and connects the first ground pattern portion and the second ground pattern portion, with the first lead wire and the second lead wire interposed between the connection portion and the first ground pattern portion and the second ground pattern portion.

5. The electric-power control device of claim 4, wherein the connection portion is a ground electrode provided on a control substrate of an apparatus incorporating the electric motor.

6. The electric-power control device of claim 5, wherein the connection portion is formed narrower than the first ground pattern portion and the second ground pattern portion.

7. The electric-power control device of claim 1, wherein the microcomputer and the connector are separated from each other by a distance which is longer than a distance between the through hole and the connector.

8. The electric-power control device of claim 1,
wherein the power semiconductor module includes two ground terminals including the ground terminal,
wherein the first ground pattern portion includes
a first high-pressure ground pattern portion provided as a ground electrode connected to one of the ground terminals, and
a first low-pressure ground pattern portion provided as a ground electrode which is separated from the first high-pressure ground pattern portion and connected to an other of the ground terminals.

9. The electric-power control device of claim 1, wherein the substrate is integrally molded out of resin.

10. The electric-power control device of claim 1,
wherein part of the substrate that is located opposite to the connector with respect to the through hole and also located between the power semiconductor module and the microcomputer is partially cut from an outer periphery of the substrate to an inner periphery thereof.

11. The electric-power control device of claim 1, wherein the microcomputer includes a nonvolatile memory and a dedicated lead wire for use in transmission of a signal for rewriting data in the nonvolatile memory.

12. An electric motor comprising:
a rotor into which a rotation shaft is inserted;
a stator provided on an outer peripheral side of the rotor; and
the electric-power control device of claim 1,
wherein the stator and the electric-power control device are integrally molded out of a mold resin.

13. An air-conditioning apparatus in which a compressor, a condenser, an expansion valve and an evaporator are connected by pipes to circulate refrigerant, the air-conditioning apparatus comprising:
a fan which sends air to at least one of the condenser and the evaporator; and
the electric motor of claim 12 which serves as a power source for the fan.

14. A method for manufacturing an electric motor including a rotor into which a rotation shaft is inserted and a stator which is provided on an outer peripheral side of the rotor, the method comprising:
a ground pattern forming step of forming, on an annular substrate including a through hole through which the rotation shaft passes, a first ground pattern portion which is connected to a ground terminal of a power semiconductor module and a second ground pattern portion which is connected to a ground terminal of a microcomputer; and
a component mounting step of mounting the power semiconductor module on a first region which is one of sides of the substrate which are divided with respect to a straight line connecting a center of the through hole to a center of a connector provided at a peripheral portion of the substrate, and also mounting the microcomputer on a second region which is an other of the substrate,
in the ground pattern forming step, the first ground pattern portion being formed to extend from the power semiconductor module toward the connector in the first region, and the second ground pattern portion being formed to extend from the microcomputer toward the connector in the second region and separately from the first ground pattern portion.

15. The method for manufacturing an electric motor of claim 14,
wherein in the component mounting step, a magnetic-pole position detection sensor which detects a position of the rotor is further mounted,
the method further comprising a measuring and writing step of measuring, after the component mounting step, a phase shift between a magnetic-pole position of the rotor and a magnetic-pole position detection signal output from the magnetic-pole position detection sensor and an overcurrent limit value, and writing the measured phase shift and overcurrent limit values to the nonvolatile memory of the microcomputer.

* * * * *